(12) United States Patent
Machado et al.

(10) Patent No.: US 6,848,943 B2
(45) Date of Patent: Feb. 1, 2005

(54) SHIELDED CONNECTOR ASSEMBLY AND METHOD OF MANUFACTURING

(75) Inventors: Russell L. Machado, San Diego, CA (US); Aurelio J. Gutierrez, Bonita, CA (US); Dallas A. Dean, Oceanside, CA (US)

(73) Assignee: Pulse Engineering, Inc., San Diego, CA (US)

( * ) Notice: Subject to any disclaimer, the term of this patent is extended or adjusted under 35 U.S.C. 154(b) by 0 days.

(21) Appl. No.: 10/417,743

(22) Filed: Apr. 16, 2003

(65) Prior Publication Data

US 2003/0228799 A1 Dec. 11, 2003

Related U.S. Application Data

(60) Provisional application No. 60/373,126, filed on Apr. 16, 2002.

(51) Int. Cl.[7] .............................................. H01R 13/648
(52) U.S. Cl. ..................... 439/607; 439/620; 439/676
(58) Field of Search ................................ 439/607–610, 439/676, 620, 76.1

(56) References Cited

U.S. PATENT DOCUMENTS

| | | | | |
|---|---|---|---|---|
| 4,641,901 A | * | 2/1987 | Brennan et al. | 439/344 |
| 4,653,837 A | * | 3/1987 | Phillipson et al. | 439/607 |
| RE32,691 E | | 6/1988 | Dola et al. | |
| 4,941,848 A | * | 7/1990 | Philippson et al. | 439/607 |
| 5,015,981 A | | 5/1991 | Lint et al. | |
| 5,628,653 A | * | 5/1997 | Haas et al. | 439/607 |
| 6,007,359 A | * | 12/1999 | Kosmala | 439/329 |
| 6,010,367 A | | 1/2000 | Wu | |
| 6,116,963 A | | 9/2000 | Shutter | |
| 6,227,911 B1 | | 5/2001 | Boutros et al. | |
| 6,299,362 B1 | | 10/2001 | Gilliland et al. | |
| 6,364,709 B1 | | 4/2002 | Jones | |
| 6,368,153 B1 | | 4/2002 | Hwang | |
| 6,416,361 B1 | | 7/2002 | Hwang | |
| 6,419,523 B1 | | 7/2002 | Jones et al. | |
| 6,428,361 B1 | | 8/2002 | Imschweiler et al. | |

(List continued on next page.)

OTHER PUBLICATIONS

Information sheets on 10–Gigabit Pluggable Solutions (no date) (3 pages) (www.molex.com).

(List continued on next page.)

Primary Examiner—Gary Paumen
(74) Attorney, Agent, or Firm—Gazdzinski & Associates

(57) ABSTRACT

An advanced shielded modular plug connector assembly incorporating a removable insert assembly disposed in the connector housing, the insert assembly adapted to optionally receive one or more electronic components. In one exemplary embodiment, the connector assembly comprises a single port connector with integral shielded housing and dual-substrate insert assembly. The housing is advantageously formed using a metal casting process which inherently shields the connector (and exterior environment) from EMI and other noise while allowing for a reduced housing profile. In another embodiment, a plurality of light sources are disposed within (and shielded by) the metallic housing. In yet another embodiment, the connector assembly comprises a multi-port "1×N" device. In yet another embodiment, a bail mechanism is provided to permit easy insertion/removal of the connector assembly from an external structure such as a rack or enclosure. Methods for manufacturing the aforementioned embodiments are also disclosed.

19 Claims, 21 Drawing Sheets

U.S. PATENT DOCUMENTS

| | | |
|---|---|---|
| 6,430,053 B1 | 8/2002 | Peterson et al. |
| 6,434,015 B1 | 8/2002 | Hwang |
| 6,439,918 B1 | 8/2002 | Togami et al. |
| 6,443,768 B1 | 9/2002 | Dirkers et al. |
| 6,478,622 B1 | 11/2002 | Hwang |
| 6,530,785 B1 | 3/2003 | Hwang |
| 6,533,470 B2 | 3/2003 | Ahrens |
| 6,533,603 B1 | 3/2003 | Togami |
| 6,554,638 B1 | 4/2003 | Hess et al. |
| 6,585,540 B2 * | 7/2003 | Doyle, III et al. ......... 439/620 |
| 6,642,827 B1 | 11/2003 | McWilliams et al. |
| 6,705,894 B1 * | 3/2004 | Comerci et al. ......... 439/607 |
| 2003/0063397 A1 | 4/2003 | Inujima et al. |
| 2003/0063424 A1 | 4/2003 | Inujima et al. |
| 2003/0072540 A1 | 4/2003 | Huang |

OTHER PUBLICATIONS

XFP Specification Revision 2.0—Publication History (1 page); Chapter 6: Mechanical and Board Definition (pp. 95–96); (Dec. 16, 2002, copyright ©2002 by XFP MSA).

Information sheet on PicoLight 1.062 and 2.125 Gbps SFP Shortwave Transceiver—3.8 Front panel opening, Fig. 6 and 3.9 Module Outline, Fig. 7 (p. 13 of 16) (Apr. 2002).

MicroNews Third Quarter 2000, vol. 6, No. 3 Article entitled "A Novel Low–Cost Small–Form–Factor Tranceiver Module" by William K. Hogan, David P. Gaio, Mitchell S. Cohen, and Jean M. Trewhella (pp. 1–2 of 10) (http://www–3.ibm.com).

Small Form–factor Pluggable (SFP) Transceiver MultiSouce Agreement (MSA)—fig. 1A and 1B—Drawing of SFP Transceiver, Fig. 2—Recommended Pattern Layout for SFP Printed Circuit Board; Fig. 6— SFP Transceiver Connector Illustration; Fig. 7A and 7B—SFP Cage Assembly (pp. 7–9, 15, 18–19) (Sep. 14, 2000).

EBN Article entitled "Seeking Common Ground in Fiber–Optic Design" by Gina Ross (Nov. 13, 2000) (5 pages) (www.ebnews.com).

Engineeringtalk product news from Selectronix entitled "Small form factor pluggable optical transceivers" (Oct. 2, 2000) (1 page) (www.engineeringtalk.com); and Information sheet on MPLC–20–8–X–XL Optical Fibre Channel—+3.3V Small Form Factor Pluggable (SFP)— 2.125Gbaud (no date) (1 page) (www.selectronix.com.uk).

Heilind Electronics article entitled "New SFP 1000Base–T Adapter Enables Gigabit Ethernet Applications" by Supercomm 2003 (Jun. 3, 2003) (2 pages) (www.heilind.com).

Hitachi Cable information sheets on Optical Transceiver for Fibre Channel (copyright©2003) (2 pages) (www.hitachi–cable.co.jp).

Hitachi Cable information sheet on Optical Transceiver for Gigabit Ethernet (no date) (p. 1 of 2) (www.hitachi–cable.co.jp).

Hitachi Cable information sheets on Optical Transceiver for SONET/SDH (no date) (pp. 1–2 of 4) (www.hitachi–cable.co.jp).

* cited by examiner (1 OF 3)

(2 OF 3)

(3 OF 3)

SHIELDED CONNECTOR ASSEMBLY AND METHOD OF MANUFACTURING

PRIORITY

This application claims priority benefit of U.S. Provisional Application Ser. No. 60/373,126 filed Apr. 16, 2002 of the same title, which is incorporated herein by reference in its entirety.

BACKGROUND OF THE INVENTION

1. Field of the Invention

The present invention relates generally to electronic components and particularly to an improved design and method of manufacturing a single- or multi-port connector assembly which includes internal electronic components.

2. Description of Related Technology

Modular (e.g., RJ-type or similar) connectors are well known in the electrical arts. Such connectors typically include a variety of signal conditioning components such as choke coils, transformers, filters, and the like in order to condition the signal they pass.

Recent trends in data networking have demanded ever increasing levels of signal and electrical performance in connectors and their associated circuitry. For example, it is highly desirable to provide high data rates (often exceeding 1 Gbps) such as those dictated by the well-known Gigabit Ethernet standards over, e.g., Category 5 twisted pair conductors and their associated RJ-45 connectors, thereby obviating more exotic optical fiber or similar solutions. Other applications desire to create an interface between an Ethernet environment and an optically-based network. These applications all generally require a high bi-directional data rate, low EMI (noise), and a small form factor (i.e., high spatial density), the connector in effect comprising a bi-directional transceiver.

So-called small form factor pluggable (SFP) connectors have recently come into being to address these needs. The so-called SFP-MSA consortium (Small Form Factor Transceiver Multi-Source Agreement) is meant to establish multi-source availability and compatibility for such transceivers (connectors).

Since in general consumers are highly sensitive to the cost and pricing of electronic assemblies, there exists a constant tension between producing a connector/transceiver assembly which has the best possible (speed and noise) performance and spatial density, yet with the lowest possible cost. Hence, the most desirable situation is that where comprehensive noise shielding can be implemented with little impact on the form factor or cost of the finished product as a whole. Additionally, in certain applications, since board space ("footprint") and volume are such important factors in miniaturized electronic components, improvements in performance and noise shielding ideally should in no way increase the size of the component. Flexibility in the types and number of internal signal conditioning components accommodated by the device (so-called "agnosticism") is also important, thereby allowing one housing of form factor to be configured for a variety of different applications.

Based on the foregoing, it would be most desirable to provide an improved connector/transceiver assembly and method of manufacturing the same. Such an improved assembly would be reliable, and provide enhanced noise suppression, while occupying a minimum volume. Additionally, such improved device could be manufactured easily and cost-efficiently.

SUMMARY OF THE INVENTION

The present invention satisfies the aforementioned needs by an improved connector apparatus and method for manufacturing the same.

In a first aspect of the invention, an improved connector assembly for use on, inter alia, a connector rack, cage, or other device is disclosed. The connector assembly generally comprises a substantially metallic (or metallized substrate) housing which contains and shields a number of electronic components. In one exemplary embodiment, the connector comprises a housing with a recess adapted to receive at least a portion of a modular plug, the modular plug having a plurality of terminals disposed thereon, the housing further comprising first and second portions; at least one substrate having a plurality of electrically conductive pathways associated therewith; and a plurality of first conductors disposed at least partly within the recess, the first conductors being configured to form an electrical contact with respective ones of the terminals of the plug and form at least one electrical pathway between the first conductors and at least one of the plurality of conductive pathways of said first substrate.

In a second exemplary embodiment, the assembly comprises a connector housing having a plurality of connectors arranged in a port group; e.g., side-by-side ("1×N") configuration, each of the connectors incorporating the components described above. The components for each respective port of the group may be uniform in configuration, or alternatively may be varied as desired to provide differing functionality.

In a third exemplary embodiment, the connector is made to fit a substantially conventional modular jack footprint via a small form factor housing adapted for mating on a PCB board.

In a fourth exemplary embodiment, the connector assembly includes a plurality of light sources (for example, LEDs) disposed within and shielded by the housing.

In a second aspect of the invention, an improved connector latch arrangement is disclosed. The latch generally comprises an arm or lever on the front end of the connector, which is coupled to another lever (e.g., plate) which selectively engages/disengages a latch from the external device to which the connector is mated. This advantageously allows the user to selectively decouple the connector from the supporting external structure, even when a modular plug is received within the port of the housing.

In a third aspect of the invention, an improved insert assembly for use with a connector is disclosed. In one exemplary embodiment, the insert assembly comprises (i) first and second conductors and (ii) first and second substrates, the first conductors adapted to mate with the terminals of the modular plug, and the second conductors adapted to mate the first and second substrates. In one exemplary embodiment, the second substrate is optionally populated with customer-selected components, and is made accessible to the customer via the aforementioned two-portion housing arrangement. The edge of the second substrate is also utilized as an electrical connector.

In a fourth aspect of the invention, an improved electronic assembly utilizing the aforementioned connector assembly is disclosed.

In a fifth aspect of the invention, an improved method of manufacturing the connector and insert assembly of the present invention is disclosed. The method generally comprises: forming an organizer element having a plurality of grooves and adapted to be received within the connector housing; forming a plurality of first conductors; providing a plurality of second conductors; providing first and second substrates; mating a portion of the first conductors to the first substrate, and the second conductors to both the first and second substrates; positioning the first conductors within the organizer element, thereby completing the insert assembly. The insert assembly is then disposed within a housing to form the connector.

BRIEF DESCRIPTION OF THE DRAWINGS

The features, objectives, and advantages of the invention will become more apparent from the detailed description set forth below when taken in conjunction with the drawings, wherein:

FIG. 2c is a front plan view of the exemplary first conductor carrier of the assembly of FIG. 2a.

FIG. 2d is a perspective view of the exemplary second carrier element of the assembly of FIG. 2a.

FIG. 3 is an exploded perspective view of an alternate embodiment of the connector of the invention, including light sources.

FIG. 3a is side cross-sectional view of the connector of FIG. 3, taken along line 3a—3a.

DETAILED DESCRIPTION OF THE PREFERRED EMBODIMENT

Reference is now made to the drawings wherein like numerals refer to like parts throughout.

It is noted that while the following description is cast primarily in terms of one or a plurality of RJ-type connectors and associated modular plugs of the type well known in the art, the present invention may be used in conjunction with any number of different connector types. Accordingly, the following discussion of the RJ connectors and plugs is merely exemplary of the broader concepts.

As used herein, the terms "electrical component" and "electronic component" are used interchangeably and refer to components adapted to provide some electrical function, including without limitation inductive reactors ("choke coils"), transformers, filters, gapped core toroids, inductors, capacitors, resistors, operational amplifiers, transistors, diodes (including LEDs), and semiconductor or other lasers or optical transceivers, whether discrete components or integrated circuits, whether alone or in combination. For example, the improved toroidal device disclosed in co-Assignee's co-pending U.S. patent application Ser. No. 09/661,628 entitled "Advanced Electronic Microminiature Coil and Method of Manufacturing" filed Sep. 13, 2000, which is incorporated herein by reference in its entirety, may be used in conjunction with the invention disclosed herein. Furthermore, so-called "interlock base" assemblies such as those manufactured by the Assignee hereof and described in detail in, inter alia, U.S. Pat. No. 5,015,981 entitled "Electronic Microminiature Packaging and Method", issued May 14, 1991, and incorporated by reference herein in its entirety, may be used.

As used herein, the term "signal conditioning" or "conditioning" shall be understood to include, but not be limited to, signal voltage transformation, filtering, current limiting, sampling, processing, transceiving, and time delay.

As used herein, the term "port group" refers to a 1×N row modular connector in which the ports are in a substantially side-by-side arrangement; i.e., one port disposed substantially adjacent the other port or ports, respectively.

Single Port Embodiment

Figure 1:
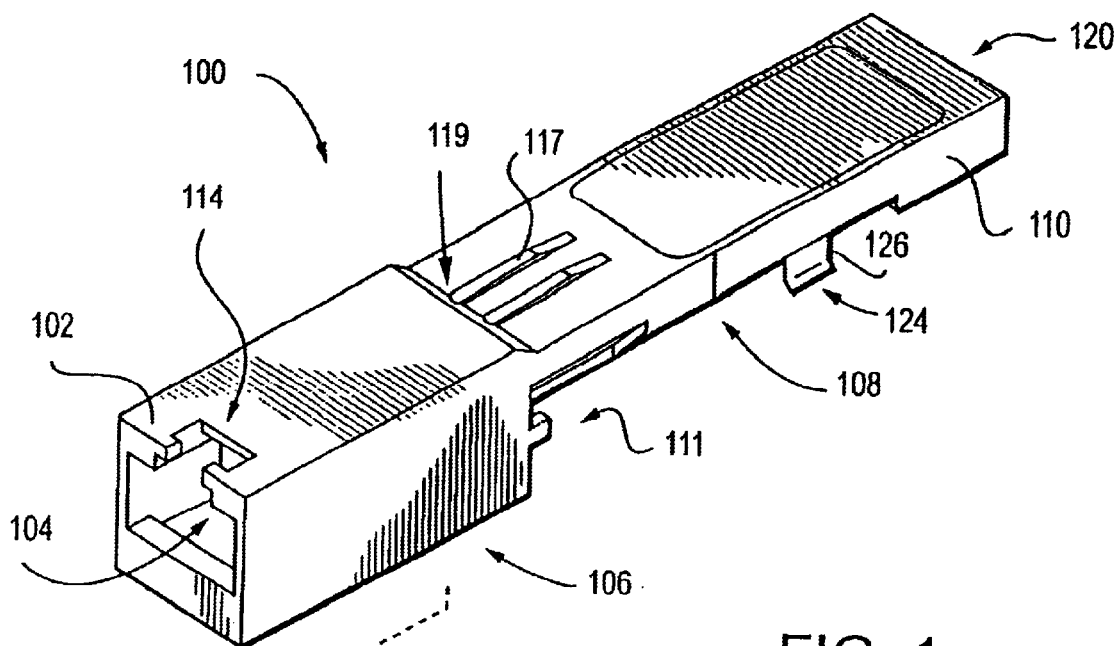
FIG. 1 is an exploded perspective view of a first exemplary embodiment (single port) of the connector assembly according to the present invention.
Figure 1:
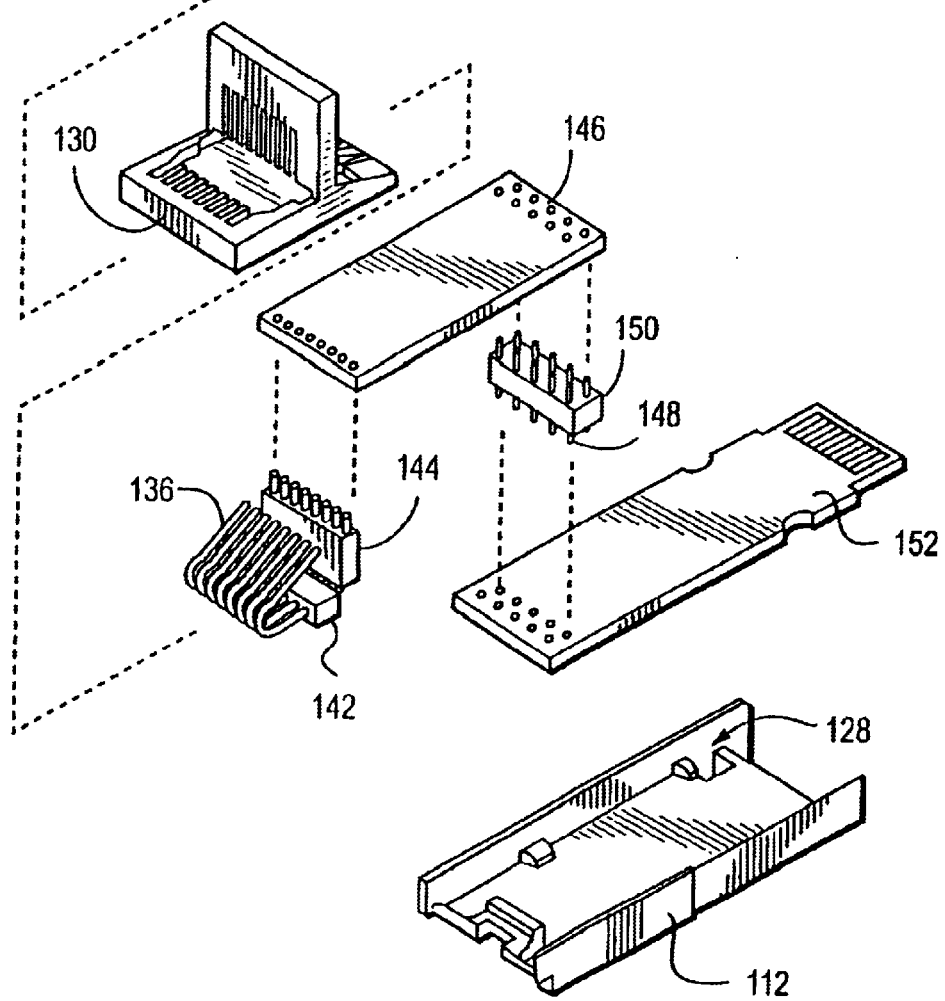
Figure 1A:
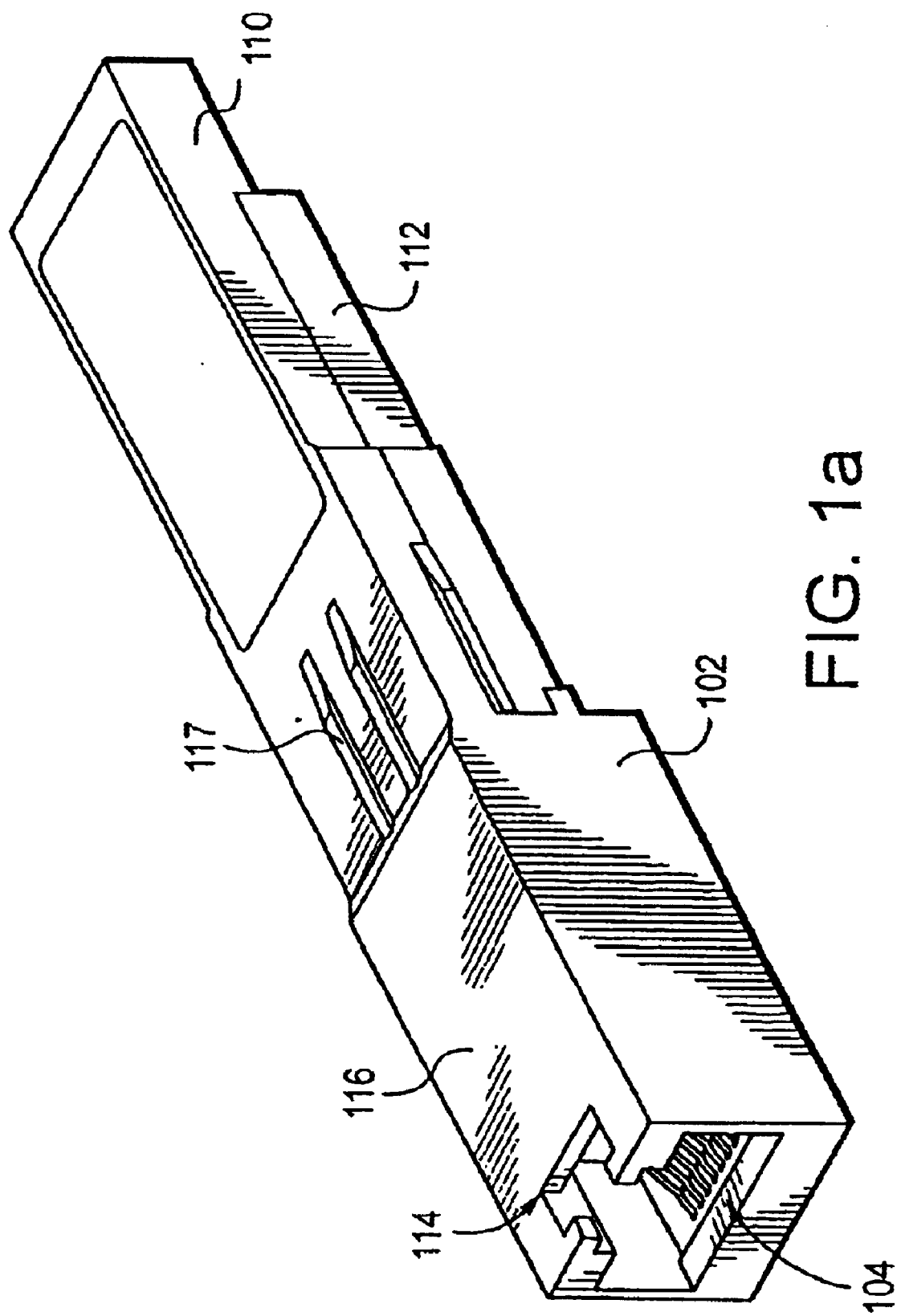
FIG. 1a is a front perspective view of the connector assembly of FIG. 1, shown fully assembled.
Figure 2:
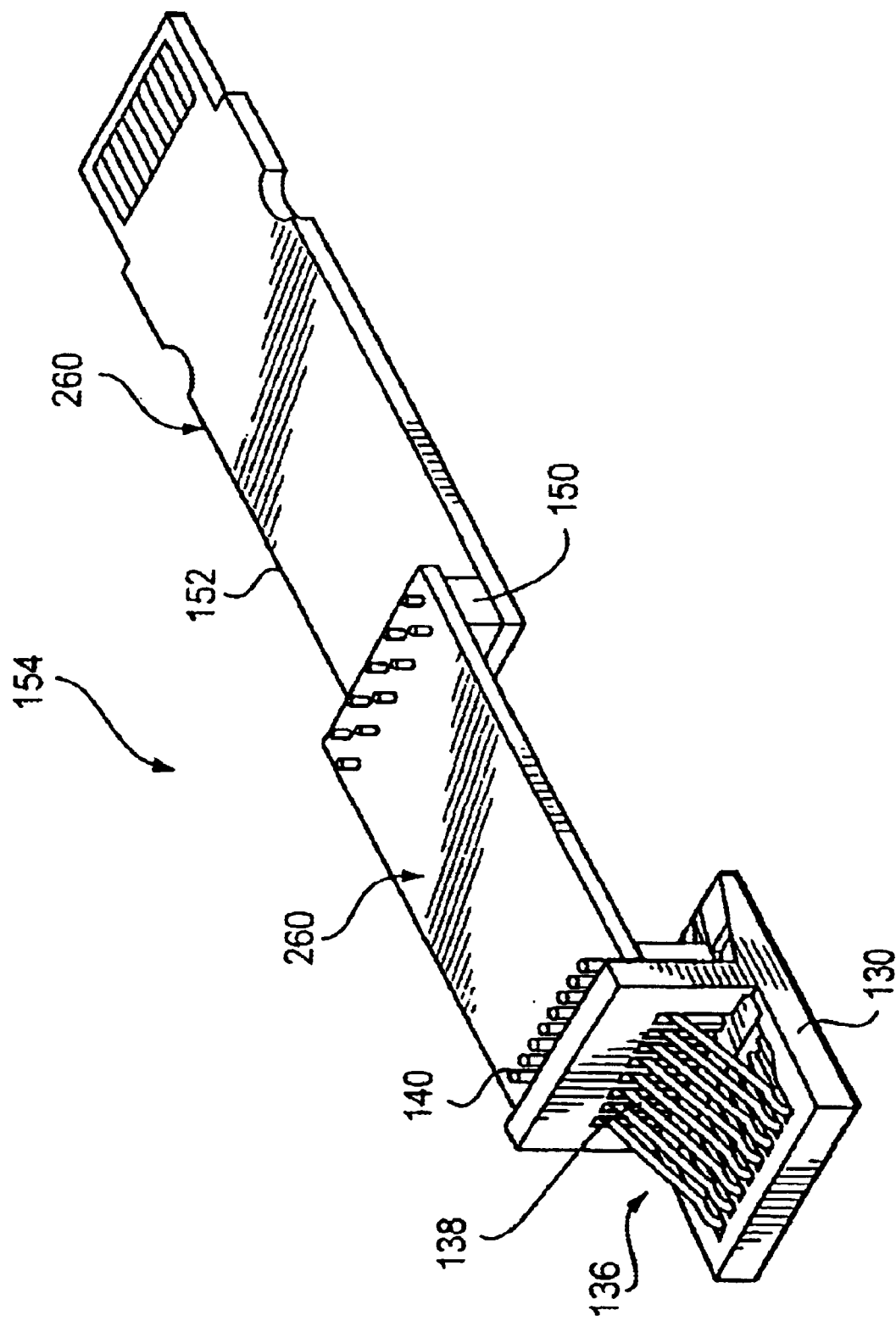
FIG. 2 is a perspective view of the assembled insert assembly of the connector of FIG. 1.
Figure 2A:
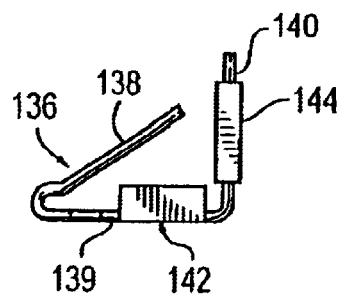
FIG. 2a is a side plan view of the conductor assembly and associated carriers used as part of the insert assembly of FIG. 2.
Figure 2B:
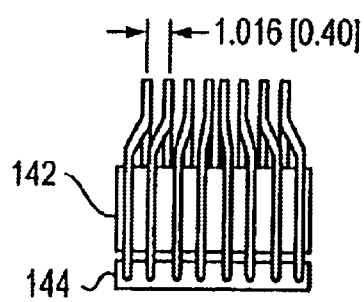
FIG. 2b is a bottom plan view of one exemplary embodiment of the conductor assembly of FIG. 2a, showing the variable pitch thereof.
Figure 2C:
Figure 2D:
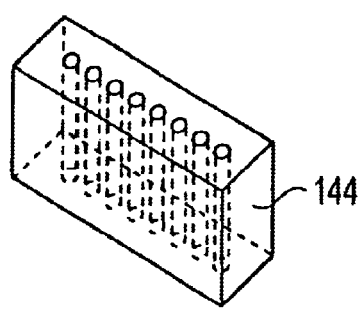
Figure 2E:
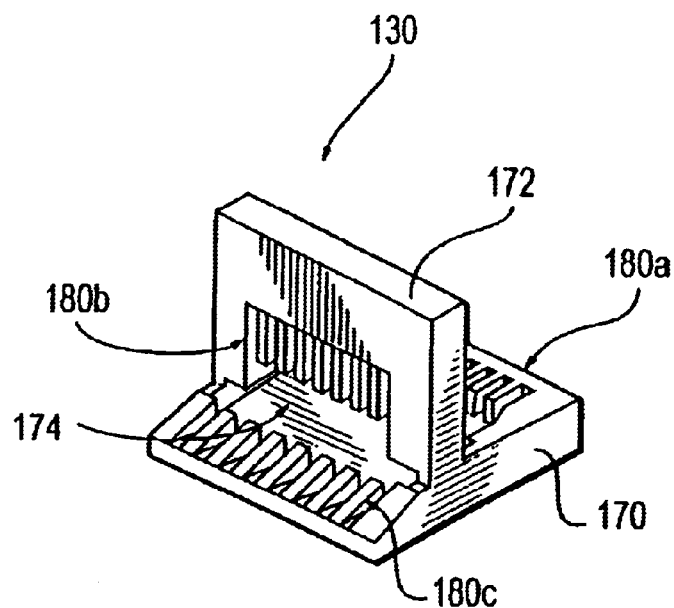
FIGS. 2e–2f illustrate the exemplary embodiment of the organizer element according to the invention shown in rear perspective and top plan, respectively.
Figure 2F:
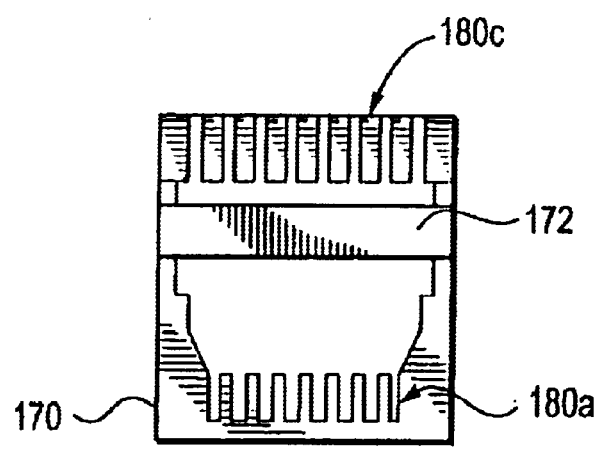
Figure 2G:
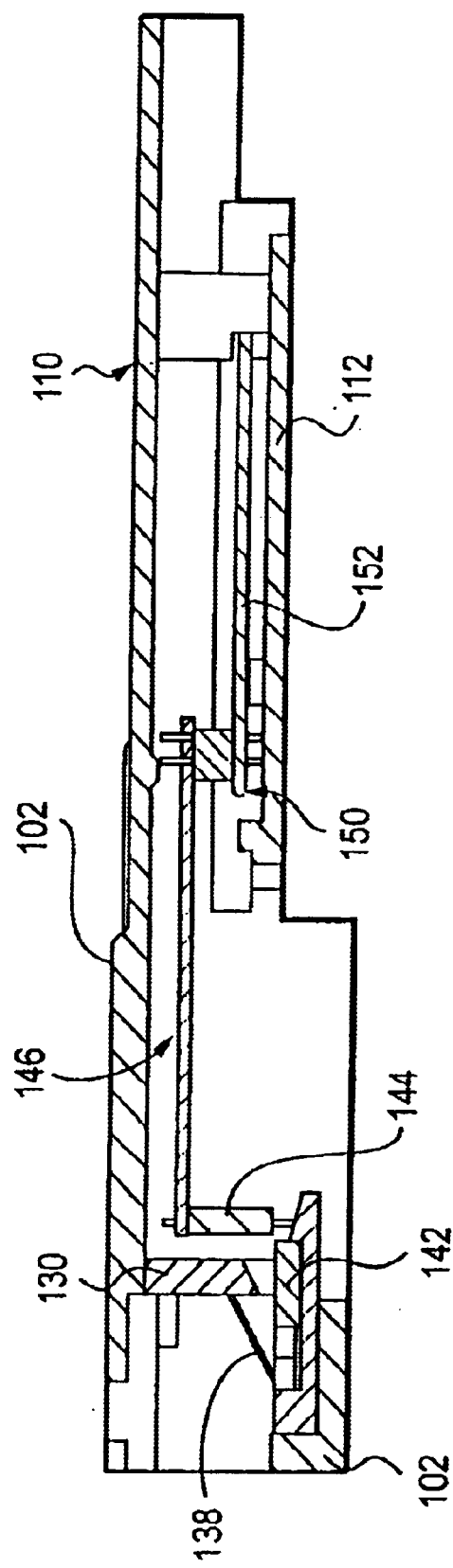
FIG. 2g is a cross-sectional view of the connector assembly of FIG. 1a taken along line 2g—2g, showing the disposition of the substrates within the housing.
Figure 2H:
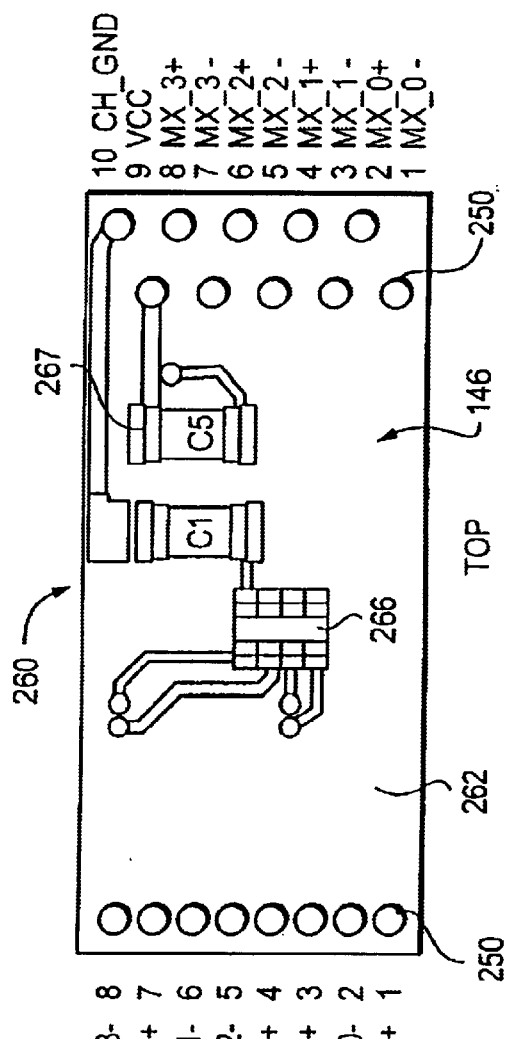
FIGS. 2h and 2i are top and bottom plan views respectively, of an exemplary first substrate configuration, showing the population of components thereon.
Figure 2I:
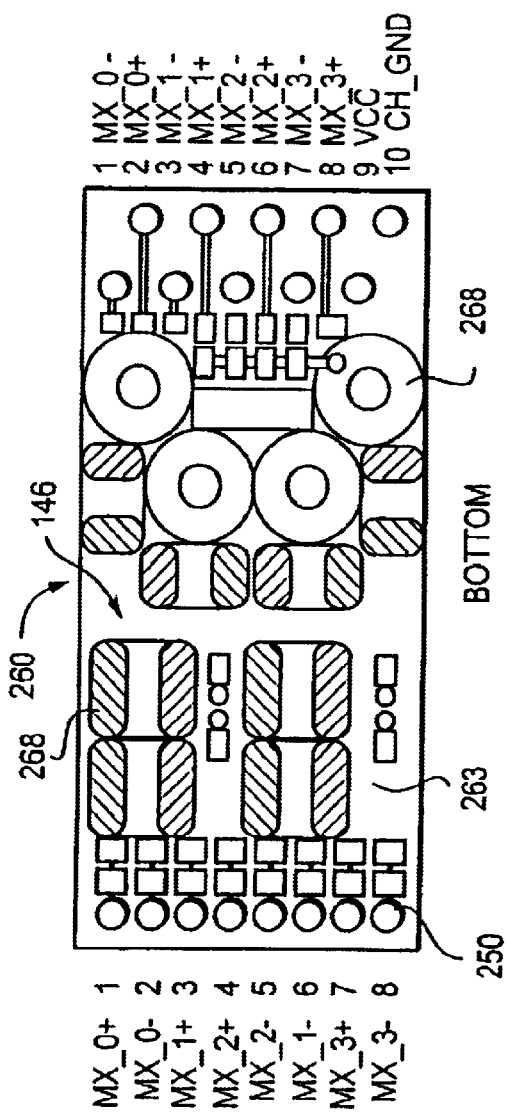
Figure 2J:
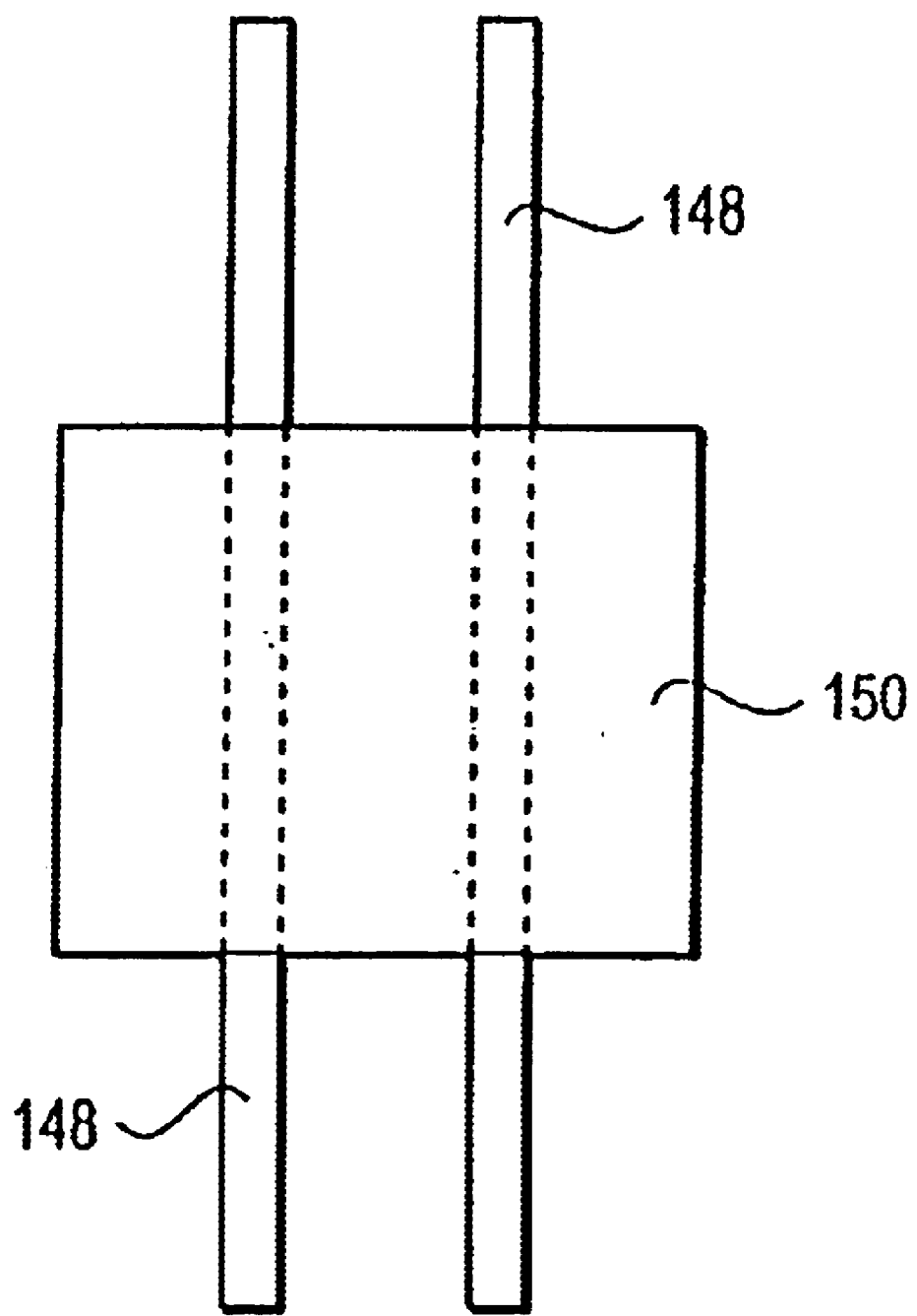
FIG. 2j is a side plan view of an exemplary embodiment of the third conductor carrier of the connector assembly of FIG. 2a FIG. 2k is a side cross-sectional view of another embodiment of the connector assembly of the invention, including multiple second substrates.

Referring now to FIGS. 1–2j, a first exemplary embodiment of the connector assembly of the present invention is described. As shown in FIGS. 1 and 1a, the assembly 100 generally comprises an elongate connector housing element 102 having a modular plug-receiving recess 104 formed therein. The connector housing element 102 comprises a generally box-like modular plug receiving portion 106 and an adjacent electronic component receiving section 108. The component receiving portion 108 is in the illustrated embodiment comprised of an upper section 110 and lower section 112, the latter mating to the upper section 110 to form an effectively closed housing for a number of different components as described in greater detail below.

As shown in FIG. 1, the front or forward wall 112 of the connector 100 is further disposed generally perpendicular or orthogonal to the component receiving section 108, although this relationship is not critical. The latch mechanism 114 is located on the top surface 116 of the plug portion 106 (so-called "latch up"), such that modular plugs may be inserted into the plug recesses 104 formed in the connectors 100, although this orientation may be inverted or otherwise altered if desired. The plug recess 104 is adapted to receive one modular plug (not shown) having a first plurality of electrical conductors disposed therein in a predetermined array, the array being so adapted to mate with respective contact portions 138 of conductors 136 present in the recesses 104 and interior cavity 111, thereby forming an electrical connection between the plug conductors and connector conductors 136, as described in greater detail below.

The connector housing element 102 in the embodiment of FIGS. 1–1a is comprised of a zinc (Zn) casting, although as discussed below, other configurations may be used. A metallic casting is used in the present embodiment for a number of reasons, including (i) to provide noise shielding adapted to suppress EMI and other noise otherwise transferred between the connector internal components and the external environment; and (ii) to make the aforementioned shielding function integral with the housing 102, such that the external profile of the housing 102 is minimized. Zinc is selected for its low cost, light weight, ease of handling/casting, and superior mechanical and electrical properties in this application; however, it will be recognized that other materials (alloyed or otherwise) may be substituted. For example, the housing 102 can be formed of copper alloys if desired. Myriad other materials are suitable for this purpose, such materials being well known to those of ordinary skill in the metallurgical arts. Furthermore, composite materials (e.g., materials with significant metallic component suspended in a polymer matrix) may be employed, the relative proportion of metal component in the matrix inter alia at least in part controlling the degree of shielding afforded by the housing.

As previously referenced, the use of a metallic casting advantageously allows the housing element 102 to integrate the shielding function, thereby reducing the profile of the connector housing 102 as compared to a typical molded thermoplastic or comparable housing with an external tin-based noise shield. For example, a typical molded RJ-45 housing profile with external copper alloy shield includes a lateral housing width of 0.555 inches. Since it is desired to fit the connector 100 of the present embodiment into a connector rack or cage (described below) having a lateral opening dimension smaller than 0.555 in., two options are presented (assuming a constant modular plug dimension): (i) reduce the wall thickness of the molded housing/tin shield; or (ii) make the shield otherwise integral with the housing. Unfortunately, there are practical limits on molded housing wall thickness and tin shield thickness necessary to accomplish their respective functions (i.e., mechanical rigidity and sufficient EMI/noise attenuation). This underscores one salient advantage of the present invention; i.e., that the housing 102 with shielding function can be made smaller than if prior art techniques are used. It is important to note, however, that such smaller dimensions are not dictated by all applications, especially where a "standard" profile RJ housing is acceptable, and accordingly the present invention should in no way be considered to be limited to reduced-size cast metallic housings.

The use of a metallic housing 102 as in the illustrated embodiment also reduces the cost of the connector assembly 100 in that the materials and labor associated with forming and installing a conventional tin external noise shield are completely obviated.

The housing 102 is cast as two discrete components as best shown in FIG. 1: (i) the plug portion 106 and upper component receiving section 110 as a first component 120; and (ii) the lower component receiving section 112. This approach advantageously allows access to the component receiving portion 108 of the housing 102, as well as ready assembly of the internals of the plug receiving portion 106. The upper portion 110 of the illustrated embodiment includes a plurality of locking elements 124 which, as shown in FIG. 1, comprise ridged tab arrangements 126 of the type well known in the mechanical arts. The tabs 126 engage corresponding retaining features 128 formed in the lower portion 112 when the housing 102 is assembled (FIG. 1a), thereby locking the upper and lower portions 110, 112 together in substantially fixed relationship. Clearly, myriad different approaches for locking the two portions 110, 112 can be utilized, including for example adhesives, friction pins/apertures, fasteners (e.g., screws), etc., such alternatives being notorious and accordingly not described further herein.

The housing 102 of the illustrated embodiment further includes a plurality of contact elements 117 disposed on the exterior surfaces of the housing 102, generally in proximity to the interface 119 between the plug portion 106 and the component portion 108. These contact elements 117 in the present embodiment comprise a plurality of "ribs" which are oriented longitudinally along the housing 102 and which are raised from the surface of the surrounding housing portion 108, so as to contact one or more metallic portions of the host device rack 123 (FIG. 1b) into which the connector 100 fits. This contact between the contact elements 117 and the rack provides an electrical current path from the connector housing 102 to ground (or other desired electrical potential). It will be recognized, however, that other types of contact element configurations may be used including, for example, raised bumps, pins, tabs, or even wires. The contact elements 117 are formed as part of the housing casting process, although other techniques (such as forming the elements 117 separately and then attaching them to the housing 102) may be used.

It will be recognized that the connector assembly of the present invention may also be utilized in connection with a "cage" of the type known in the optical telecommunications arts, wherein the individual connectors are disposed in, e.g., a side-by-side orientation on top or within a substantially horizontal surface.

Figure 1B:
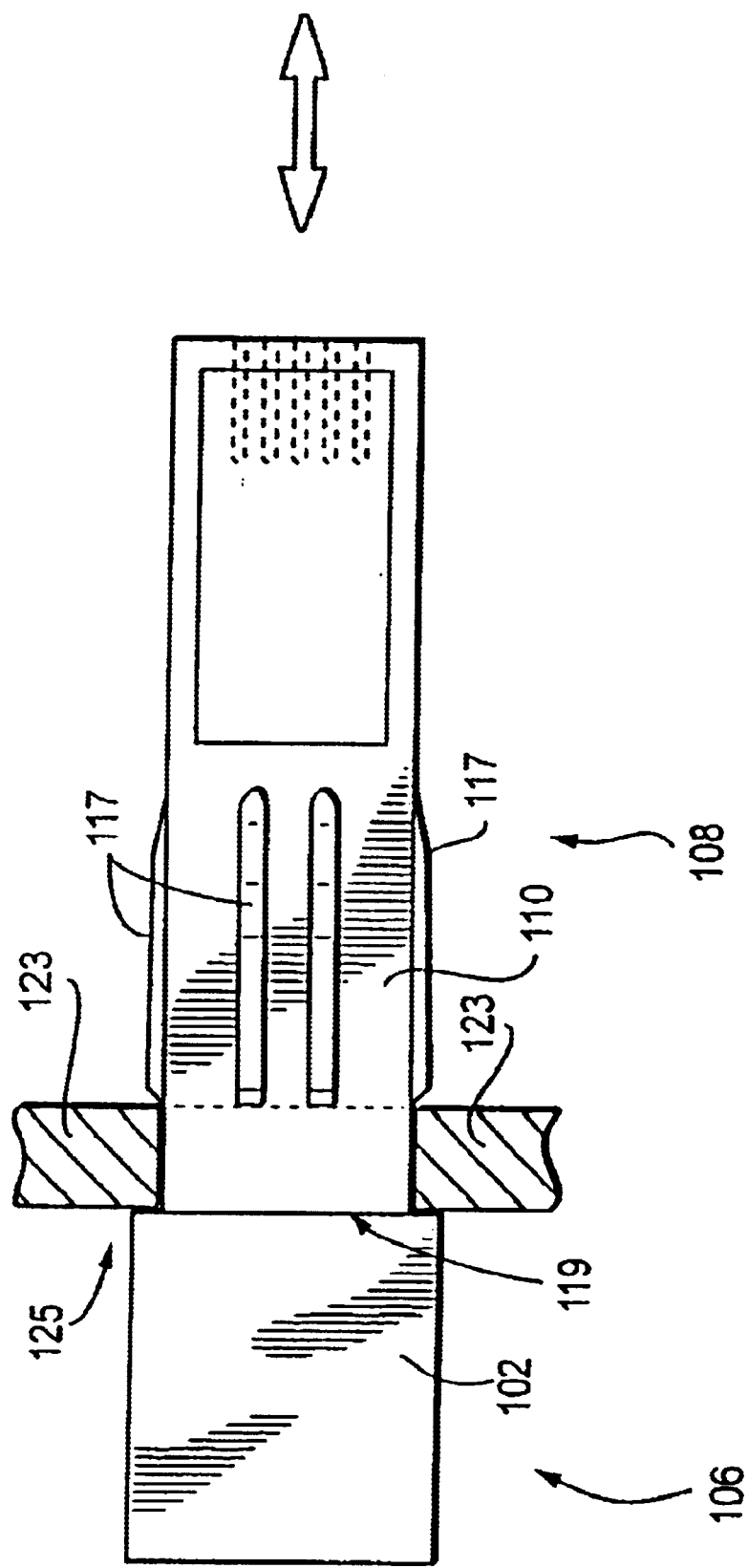
FIG. 1b is a top plan and cross-sectional view of the connector assembly of FIG. 1 installed within a host device rack assembly.

The contact elements 117 of the invention may also be configured if desired to aid in retaining the connector 100 within the rack, as shown in FIG. 1b. In this configuration, the raised ribs 117 help "snap" the connector housing 102 into the fixed dimension aperture 125 of the rack 123, thereby both securing it physically and providing the aforementioned electrical connection for the housing.

While the embodiment of FIG. 1 incorporates the aforementioned cast metallic structure 102, it will be recognized that the housing 102 of the present invention may be fabricated using a more conventional molded plastic arrangement (not shown) which has been "metallized" through, for example, the application of a tin or alloy layer of metal over at least a portion of its surface area (to optionally include any light source apertures as described subsequently herein with respect to FIG. 3). This is especially true where the profile of the connector housing is not critical.

The internal components of the exemplary connector 100 are now described with respect to FIGS. 1 and 2a–2j. As best shown in FIG. 1, the internal components of the connector 100 comprise an organizer element 130, a plurality of first conductors 136 with corresponding plug contact portions 138, base portions 139, and substrate contact portions 140, first and second conductor carriers 142, 144, first substrate 146, second conductors 148, third conductor carrier 150, and second substrate 152. When assembled, these components form a substantially planar and longitudinal insert assembly 154 as shown best in FIG. 2, which is received substantially within the interior cavity volume 111 of the connector housing 102. The cavity 111 of the housing element 102 is sized in width by approximately the width of the insert assembly 154 (FIG. 2). The cavity 111 is also sized in depth by approximately the length of the insert assembly 154. As will be described in greater detail below, the second (rear) substrate 152 includes a plurality of electrical terminals disposed at its rear edge, and the insert assembly 154 and the housing 102 are cooperatively sized to permit these terminals to mate with corresponding terminals of a host device when the connector 100 is received within the host device rack.

Another advantageous feature of the present embodiment is that the housing element 102 is configured to allow the population of the first and second substrates 146, 152 with a substantial number of electrical components using a "standard" or smaller connector housing profile (as viewed from the front face of the connector 100). Hence, the connector 100 is very internally space-efficient. Furthermore, the use of an insert assembly 154 comprising both substrates 146, 152 allows the simultaneous placement of both substrates and their components within the housing at the same time, thereby reducing assembly labor.

The first conductors 136 are metallic, of substantially rectangular cross-section (although other shapes may be substituted), and formed in a predetermined shape, including contact portion 138, base portions 139, and substrate portion 140 (see FIG. 2a). They are held within the first and second carrier elements 142, 144, the latter also optionally mating with the organizer 130. The conductors 136 further optionally include a stress relief and fulcrum portion 155 which is specially shaped to add resiliency and bias the distal ends of the plug contact portions 138 into contact with the corresponding modular plug contacts. As used herein, the term "carrier" is meant to refer to structures used to provide a predetermined function with respect to one or more conductors or terminals, such as the exemplary structures 142, 144 molded around the conductors 136 in the embodiment of FIG. 1; however other types and forms of structure may be used.

It will also be recognized that positioning or retaining elements (e.g., "contour" elements, as described in U.S. Pat. No. 6,116,963 entitled "Two Piece Microelectronic Connector and Method" issued Sep. 12, 2000), not shown, may optionally be utilized as part of the organizer 130 of the present invention. These positioning or retaining elements are used in conjunction with corresponding bends in the conductors 136 to, inter alia, position the individual conductors 136 with respect to the modular plug(s) received within the recess 104. The construction and operation of such "contour" elements and bends are described in detail in the aforementioned U.S. Pat. No. 6,116,963, which is incorporated herein by reference in its entirety.

Additionally, as shown in FIG. 2b, the spacing 210 between individual ones of the conductors 136 is varied along their length such that appropriate spacing for mating with the contacts of the modular plug (not shown) is provided at the contact portions 138 of the conductors 136, and greater spacing is maintained at the point of attachment for the first and second carriers 142, 144, and substrate contact portions 140, thereby allowing reduced electrical cross-talk across much of the length of the conductors 136, as well as maintaining the required "FCC" pitch (40 mils) at the contact portions 138 yet a larger pitch (e.g., 50 mils) at the substrate portions 140 which facilitates easier and less costly termination and less costly substrate fabrication techniques. It will be recognized that while the exemplary embodiment described herein uses 40 mil and 50 mil pitches for the plug and substrate contact portions, respectively, other spacings (including non-uniform) can be used if desired.

FIG. 2c illustrates one exemplary embodiment of the first (forward) carrier 142. Specifically. the carrier 142 comprises a substantially planar body with a central portion 162, with the bottom face 164 of the central portion 162 being flush with the interior top face of the organizer 130. The carrier 142 is adapted so as to slide within complementary slot 174 (FIG. 2e) located at the rear lower edge of the organizer 130 of the housing element 102, such that the carrier 142, and therefore conductors 136, are guided and registered into proper position within the organizer 130 when the conductors/carrier are fully inserted therein.

In another exemplary embodiment (not shown), the carrier 142 comprises a substantially planar body, having two tabs disposed on either end, the tabs each being lesser in thickness than (or "stepped down" from) the central portion 162, with the bottom face 164 of the central portion 162 being flush with the bottom faces of the tabs, such that a uniform flat surface is formed. The two tabs are adapted so as to slide within two complementary side slots located at the rear lower edge of the organizer.

It will be recognized, however, that other mechanisms or configurations of carrier guidance mechanisms, or if desired no guidance mechanism at all, may be employed consistent with the invention. For example, small pins or stakes formed on the forward edge of the carrier (not shown) could be used in conjunction with complementary apertures formed in the rear surface of the organizer wall to register the carrier upon insertion. As yet another alternative, a single pin or key (not shown) could be formed on the bottom surface 164 of the carrier 142 to cooperate with a complementary groove formed longitudinally within the bottom interior wall of the organizer 130 so as to laterally align the carrier 142 (and conductors) with respect to the aforementioned grooves 180a, 180b (described below with respect to FIG. 2e) upon assembly. Myriad other techniques and configurations could also be utilized, all other such techniques and configurations being known to and readily implemented by those of ordinary skill.

FIG. 2d illustrates one embodiment of the second carrier 144, which in the present embodiment has effectively no interaction with the organizer 130 for sake of simplicity. The variants of configuration described in the preceding paragraph with respect to the first carrier 142 may also be applied to the second carrier 144.

In the illustrated embodiment of FIGS. 2c–2d, the carrier elements 142, 144 are molded onto the conductors 136 prior to deformation of the latter, although other techniques may be used. For example, one or more of the carrier elements 142, 144 may be molded in advance (with the corresponding apertures or slots formed therein to receive respective ones of the conductors), and the carriers slid or clipped onto the conductors. In another variant, the carrier element is comprised of two half-pieces which fit together (e.g., snap-fit) around the conductors. Yet other approaches may be used, such as for example molding of the carrier onto the conductors after the latter have been formed to the desired shape.

It is further noted that the first carrier 142 may be configured such that the bottom surface 164 of that carrier 142 is effectively flush with the bottom surface of the longitudinal portion 139 of the conductors 136 (i.e., such that the carrier 142 "clips on" the conductors 136 from their upper side), thereby advantageously economizing on space within the interior of the housing element 102, and allowing the lowest possible overall profile for the connector.

Referring now to FIGS. 2e–2f, the organizer 130 of the exemplary connector 100 is described in detail. The organizer 130 is in the illustrated embodiment comprises generally horizontal and vertical planar elements 170, 172 adjoined in substantially orthogonal arrangement, although such orthogonality is not requisite. In the illustrated embodiment, the organizer 130 comprises a singular, electrically non-conductive piece formed from a thermoplastic (e.g. PCT Thermex, IR compatible, UL94V-0), although it will be appreciated that other materials, polymer or otherwise, may conceivably be used. An injection molding process is used to form organizer 130, although other processes (such as transfer molding) may be used, depending on the material chosen. The manufacture of the organizer element 130 is well understood in the art, and accordingly will not be described further herein. It will be recognized, however, that when coupled with the cast metallic housing 102 previously described herein, the electrically non-conductive feature of the organizer is significant, in that it provides the required degree of electrical separation between the first conductors 136 an the metallic housing 102.

Also formed generally within the organizer 130 are a plurality of sets of grooves 180a, 180b, which are disposed generally parallel and oriented substantially vertically and horizontally within the horizontal and vertical planar elements 170, 172 of the organizer 130, respectively. The grooves 180a, 180b are spaced and adapted to guide and receive the aforementioned first conductors 136 used to mate with the conductors of the modular plug. As previously described, the housing element 102 includes a cavity 111 formed in the plug portion 106 of the connector 100 generally adjacent to the rear wall, the cavity 111 being adapted to receive the organizer 130 (and insert assembly 154) in a substantially horizontal orientation with the plane of the insert assembly 154 being substantially parallel with the direction of the run of the base portion 139 of the first conductors (i.e. front to back within the housing 102).

A third set of grooves 180c are disposed on the rear side of the organizer 130 (i.e., on the horizontal planar element 170), which help guide the conductors 136 into the proper orientation during assembly.

The organizer 130 is received within the cavity 111 of the housing 102 in a corresponding set of wall grooves (not shown) which receive the front portion of the horizontal planar element 170 therein. The wall grooves are positioned within the walls of the housing 102 in a generally front-to-back orientation, such that the insert assembly 154 (including organizer 130 on the front end thereof) is slidably yet firmly received within the wall grooves. It will be recognized, however, that any number of other configurations for receiving the organizer and insert assembly within the housing may be utilized. For example, the cavity 111 can be sized to slidably receive the insert assembly 154 and organized without wall grooves. As yet another alternative, a lower and/or upper wall groove can be used to aid in alignment.

As shown in FIGS. 2 and 2g, the insert assembly 154 further includes first and second substrate elements 146, 152 which are disposed horizontally and in substantially non-coplanar orientation with respect to each other. In the illustrated embodiment, the substrate elements 146, 152 comprises printed circuit boards (PCBs) having a plurality of terminal apertures 250 and/or surface mount contact pads and conductive traces of the type well known in the art, although other substrate technologies may be substituted. The apertures 250 of the substrates 146, 152 are positioned so as to align with the various interface portions of the first and second conductors 136, 148, when the substrates 146, 152 are positioned in the insert assembly 154. The top surfaces of the second and third carriers 144, 150 are made substantially coplanar in the present embodiment, such that the first substrate 146, when placed atop the carriers, is substantially parallel with the bottom surface of the organizer 130. Similarly, the bottom surfaces of the third carrier 150 are made planar and the vertical height of the third carrier adjusted such that the second substrate 152 is (i) substantially parallel with the first substrate 146; and (ii) is offset from the first substrate so as to fit properly within the component portion 108 of the housing 102.

The second substrate 152 further includes a plurality of electrically conductive spaced terminals 240 disposed on the top and bottom surfaces thereof. The spacing and position of the terminals 240 (along with the thickness of the second substrate 152) are adjusted so as to positively mate the terminals 240 with corresponding terminals in a card-edge connector (not shown) of the type well known in the art. In this fashion, the distal end 244 of the substrate 152 (in cooperation with the terminals 240) acts as its own connector, thereby obviating more complicated arrangements and accordingly reducing the cost of the connector 100 as a whole. It will be recognized, however, that alternate arrangements may be utilized if desired, depending on the particular application. For example, in one alternate embodiment (not shown), multi-pin serial port type connector is disposed on the distal end 244 of the second substrate 152, the pin connector being adapted to mate with a corresponding female connector on the host equipment rack. In yet another embodiment, an integral optical source and modulator (e.g., Lithium Niobate or comparable) of the type well known in the fiberoptic arts, with supporting components, are disposed on the customer board 152, thereby providing an electrical domain-to-optical domain interface at the connector 100. Myriad other connection schemes, whether of homogeneous or heterogeneous domain, may be employed consistent with the invention.

As shown in FIGS. 2h–i, the first substrate 146 of the illustrated embodiment further includes a plurality of electronic components 260 disposed on the upper and lower surfaces 262, 263 of the substrate 146, their conductive pathways in contact with the pads/traces of the substrate, thereby forming electrical pathways from the contact portions 140 of the conductors 136 through the components 260 and to the second conductors 148. Electrical components may be disposed on either or both sides of the internal substrate 146 if desired, consistent with available room in the housing cavity 111. For example, in another exemplary embodiment, the electrical components mounted on the first substrate 146 are divided into two general groups for purposes of electrical isolation; e.g., resistors 266 and capacitors 267 are disposed primarily on one side of the substrate, while the magnetics 268 (e.g., choke coils, toroid core transformers, etc.) are disposed primarily on the other side of the substrate. Other arrangements, such as for example disposing components of discrete circuits longitudinally along the length of the substrate 146 on one side thereof, are clearly possible.

The electrical components 260 are further encapsulated in silicone or similar encapsulant for both mechanical stability and electrical isolation if desired. Any number of different component configurations (whether discrete, grouped, or integrated) of the type well known in the art may be utilized in conjunction with the substrate 146 of the invention.

Furthermore, it will be recognized that electrical components described above need not be mounted on the substrate 146; rather, in an alternate embodiment (not shown), no electrical components are placed in the electrical pathways between the first conductors 136 and the second conductors 148, and are replaced with uninterrupted runs of conductive traces on the substrate. In this fashion, the substrate acts merely to provide a plurality of conductive pathways between the conductors 136, 148. "Hybridized" configurations involving both of the foregoing (or other combinations) are also possible.

Similarly, the second substrate 152 may be left unpopulated, or alternatively be populated with a wide variety of components. In the present exemplary embodiment, the second substrate 152 is "customer" populated; i.e., the customer purchasing the device decides on the types, number, and locations of components on the second substrate 152. For example, in one contemplated application, integrated circuit devices comprising voltage regulator circuits, along with a PHY IC and associated resistors and capacitors for biasing and coupling, are used on the "customer" board. Myriad other discrete and/or integrated devices may be used.

As described in greater detail below with respect to FIG. 5, one anticipated marketing configuration for the invention includes providing the customer with a partly assembled connector with the first substrate 146 electrically populated and terminated, while the second substrate 152 is neither. The customer then populates and terminates the second substrate 152, and then completes assembly of the connector 100. This provides the customer with great flexibility in configuring their device(s). In an alternate approach, the customer sends the populated second board back to the manufacturer, who then completes the termination and assembly.

The construction of the second conductors 148 and third carrier 150 is now described in detail with respect to FIG. 2*j*. The carrier 150 comprises a molded polymer body 157 and a plurality (ten) of conductors 148 adapted to fit through the apertures 250 formed in the first substrate 146. The length of the conductors 148 protruding above the body 157 is adjusted so as to provide proper registration with the first substrate (e.g., PCB) 146, while the length below is adjusted to provide proper registration with the second substrate 152 (e.g., PCB).

It will be appreciated that one of the benefits afforded by the foregoing configuration of the third carrier 150 is the reduced conductor/terminal length and forming required. Specifically, with respect to the second conductors 148, effectively straight terminals are used, thereby obviating manufacturing steps of forming these terminals and reducing connector cost. Additionally, the placement of the substrates 146, 152 directly in proximity to the carrier 150 reduces the length of the second conductors 152, within the connector 100, thereby helping to reduce susceptibility to (and potential generation of) EMI and other deleterious effects.

Figure 2K:
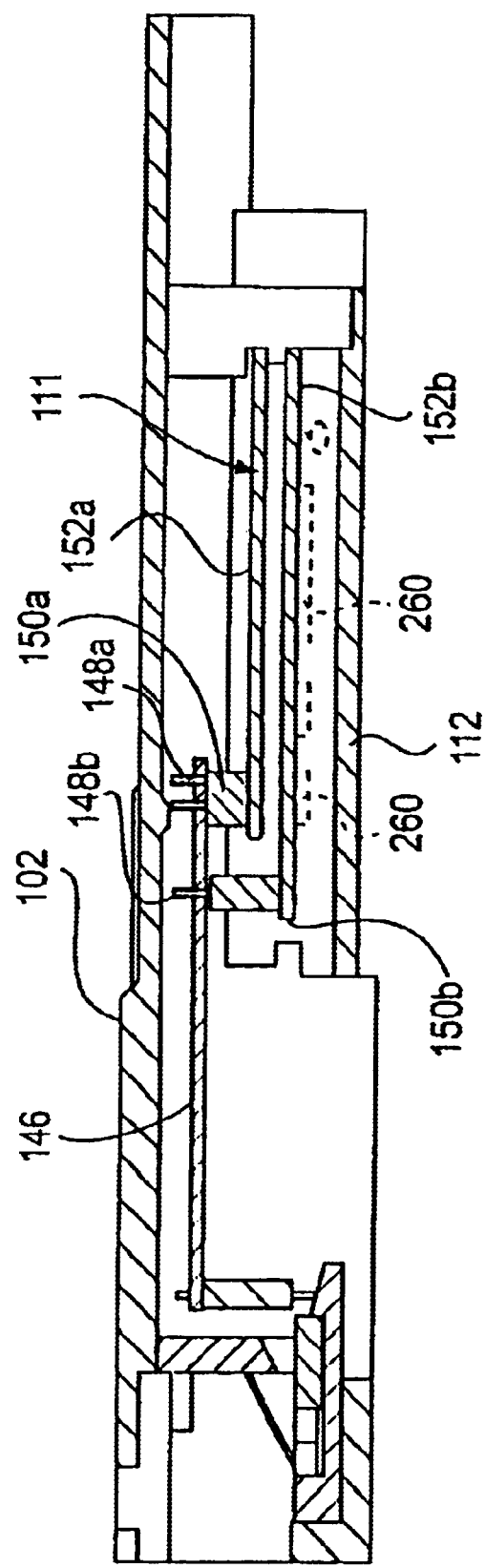

It will be recognized that while the exemplary configuration of FIGS. 1–2*j* utilizes a single second substrate 152, the connector of the invention can be readily adapted for inclusion of multiple second or "customer" substrates, for example in stacked configuration as shown in FIG. 2*k*. In this configuration, two or more secondary substrates 152*a*, 152*b* are disposed in a stacked orientation within the connector cavity 111 and electrically terminated to the first substrate 146 using respective, longitudinally offset sets of second conductors 148*a*, 148*b* and third carriers 150*a*, 150*b*. One continuous first substrate 146 could also feasibly be used, with the "customer" portion of the board comprising the distal end, although this arrangement tends to dictate for practical reasons that the connector manufacturer populate and terminate all portions of the board 146, including the customer portion.

"Standard" Footprint Embodiment

Figure 2L:
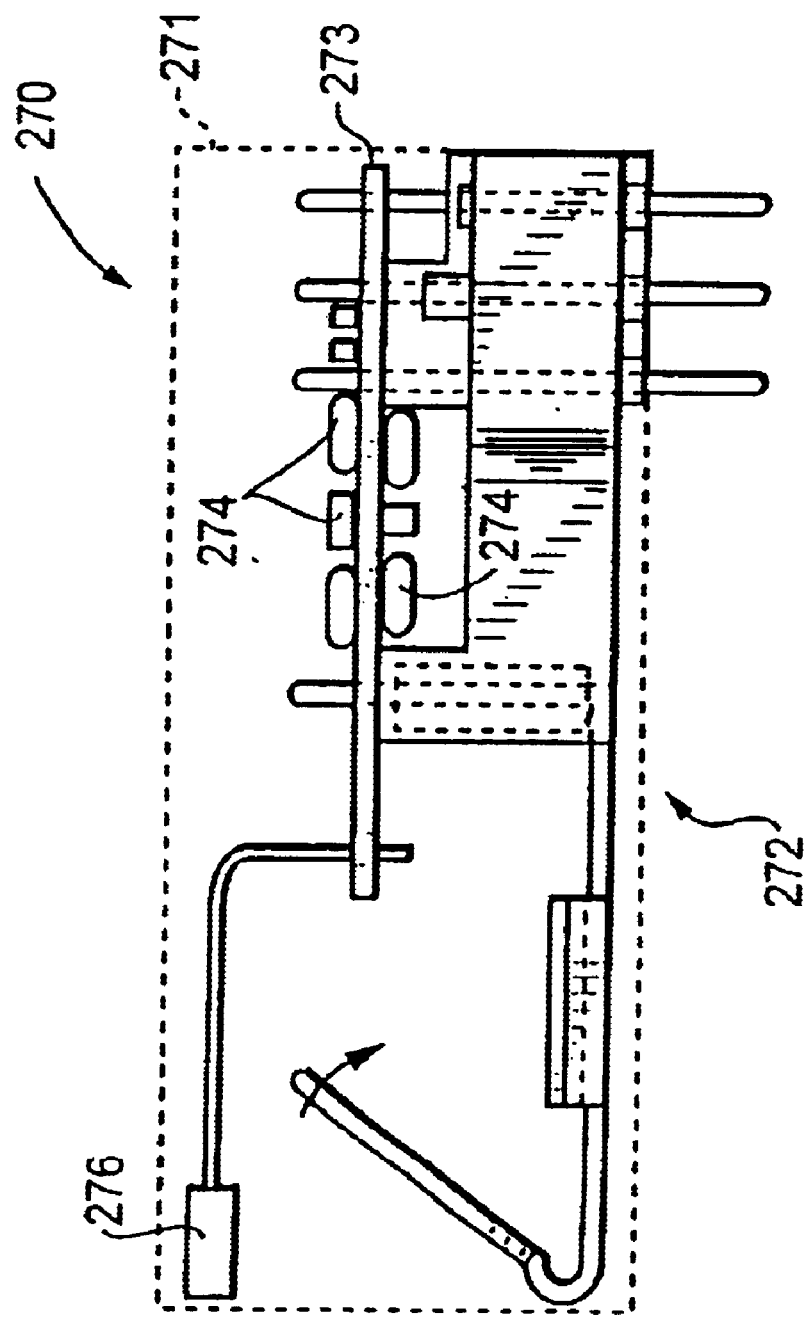
FIG. 2l is a side plan view of the insert assembly of yet another embodiment of the connector adapted to provide a smaller PCB footprint and form factor.
Figure 2M:
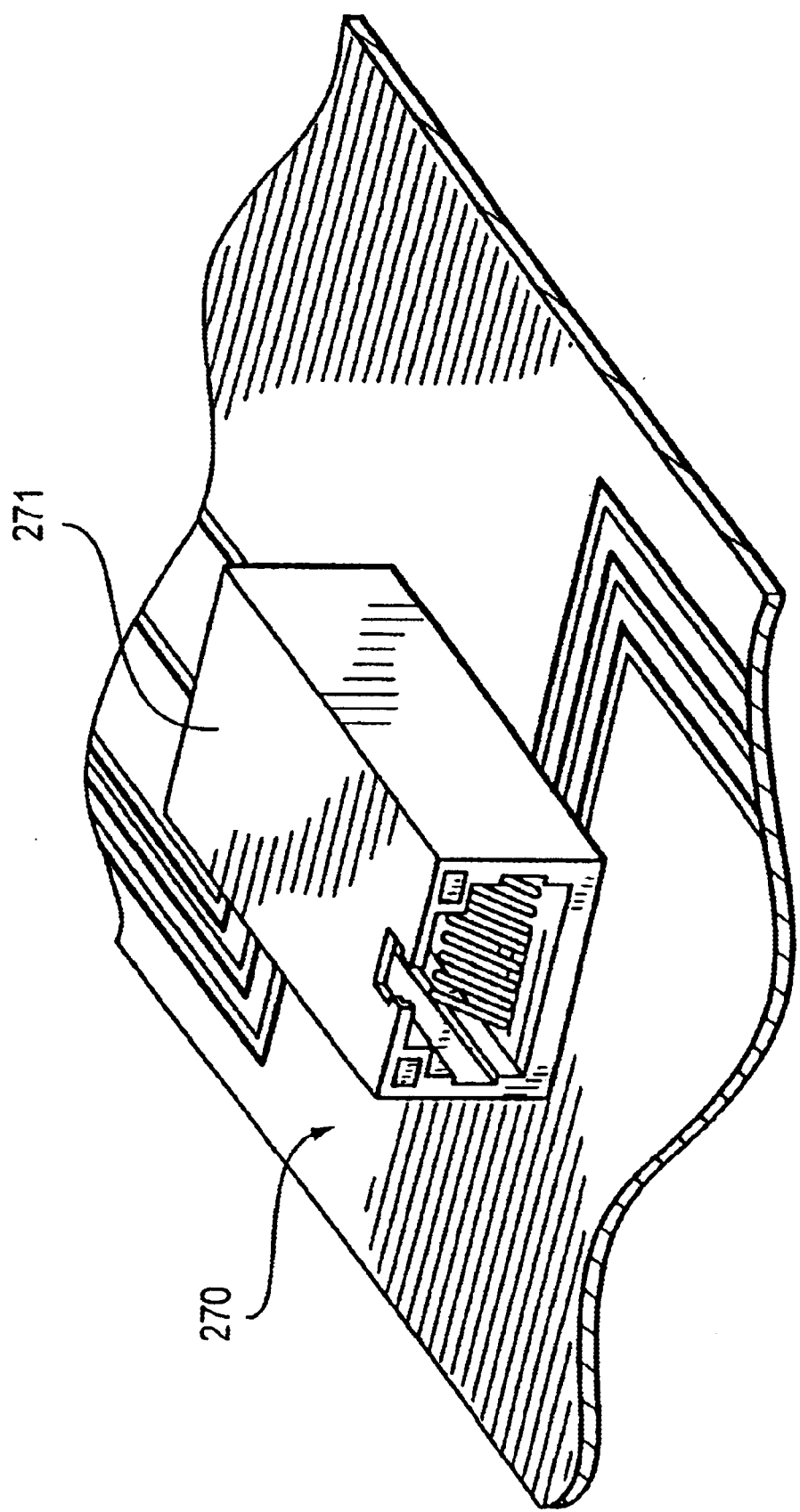
FIG. 2m is a front perspective view of the connector of FIG. 2l, showing disposition on a PCB.

Referring now to FIGS. 2*l* and 2*m*, yet another embodiment of the connector assembly of the invention is disclosed. In this embodiment, the RJ-style connector 270 comprises a substantially shortened housing 271 adapted for board mounting with a comparatively small footprint. The connector 270 includes an insert assembly 272 having a horizontally disposed internal PCB 273 with associated signal conditioning components 274 disposed thereon, and optional LEDs 276. As with the earlier embodiments, the connector of FIGS. 2*l* and 2*m* includes a metallic or alloyed housing 271 in order to provide benefits to those previously described, yet in a smaller more compact form factor. The basis for this configuration in general is described in detail in co-owned and co-pending U.S. patent application Ser. No. 10/139,907 filed May 6, 2003 and incorporated herein by reference in its entirety.

It will be further recognized that the shielding technology of the present invention may be adapted to many different connector form factors and configurations, the embodiments described herein being merely exemplary in nature.

Latch Mechanism Embodiment

Figure 2N:
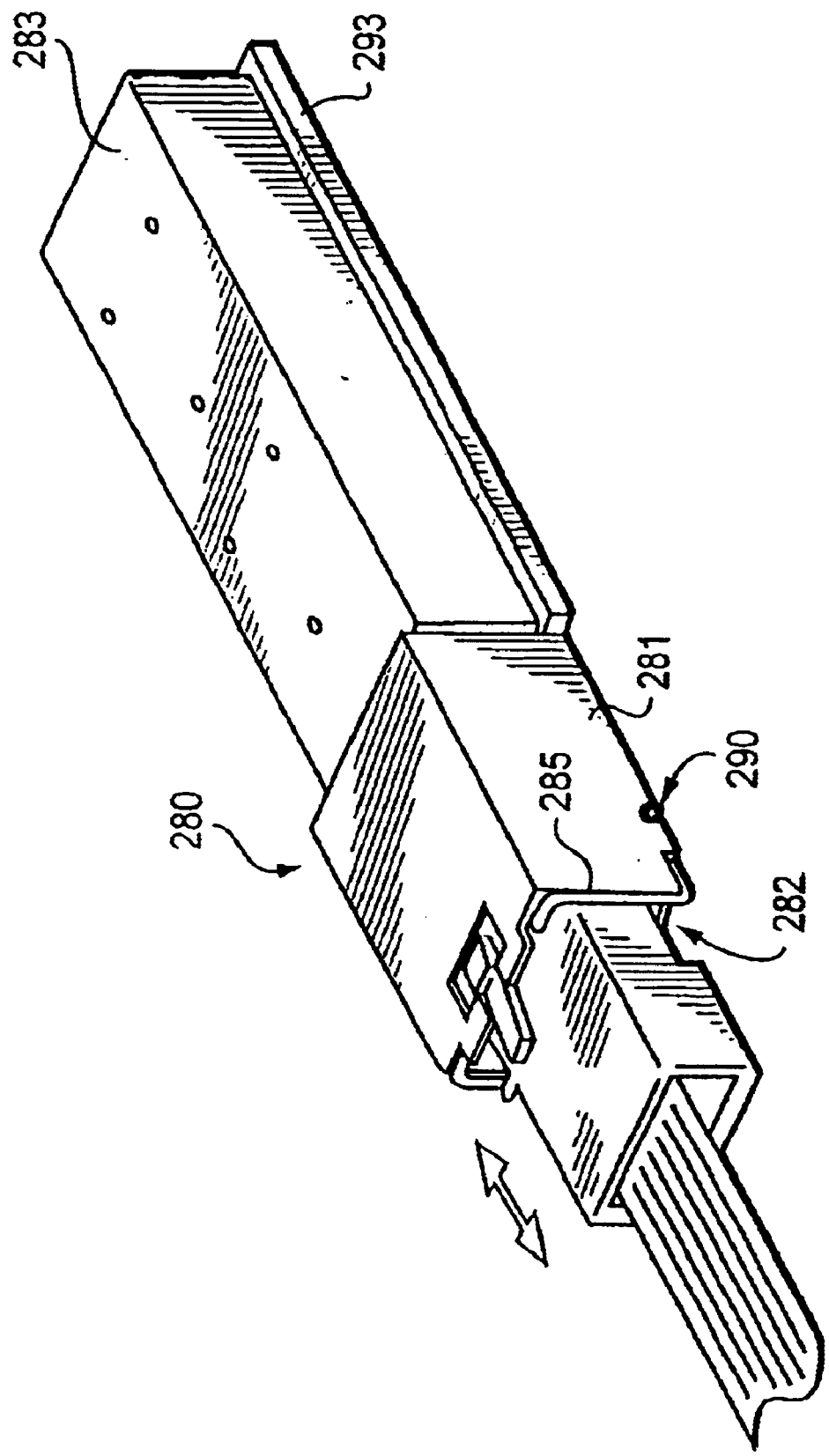
FIG. 2n is a front top perspective view of yet another embodiment of the connector of the invention, showing disposition on a PCB and a modular plug received in the port.

Referring now to FIGS. 2*n* through 2*q*, yet another embodiment of the connector of the present invention is described in detail. As shown in FIG. 2*n*, this embodiment of the connector 280 comprises an RJ-style modular jack port 282 disposed within a housing 281 generally similar to those previously described herein. A single port embodiment is shown; however, it will be recognized that the concepts of this embodiment may be extended to multi-port devices.

Figure 2O:
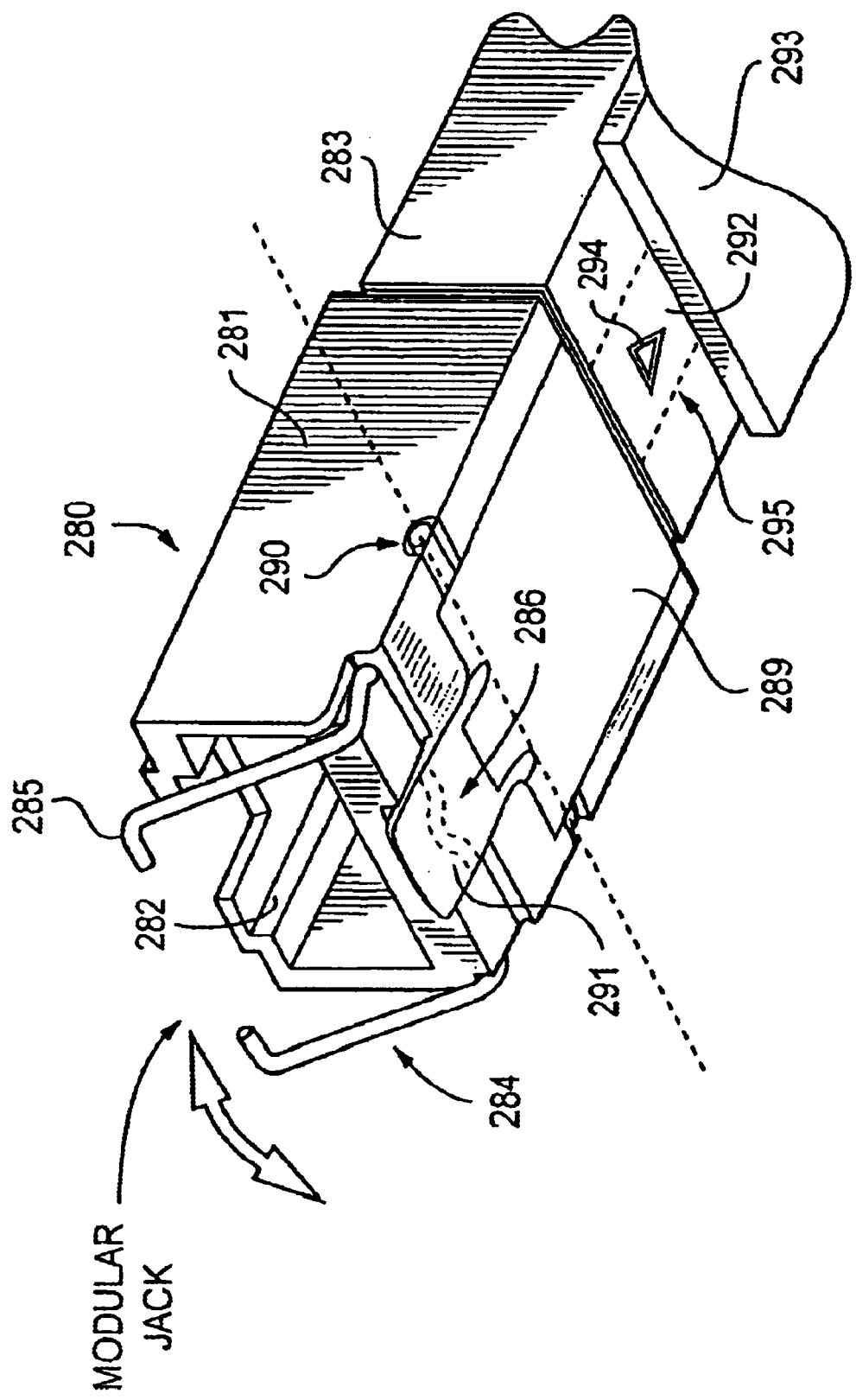
FIG. 2o is a front bottom perspective view of the connector of FIG. 2n, illustrating the latch mechanism components.
Figure 2P:
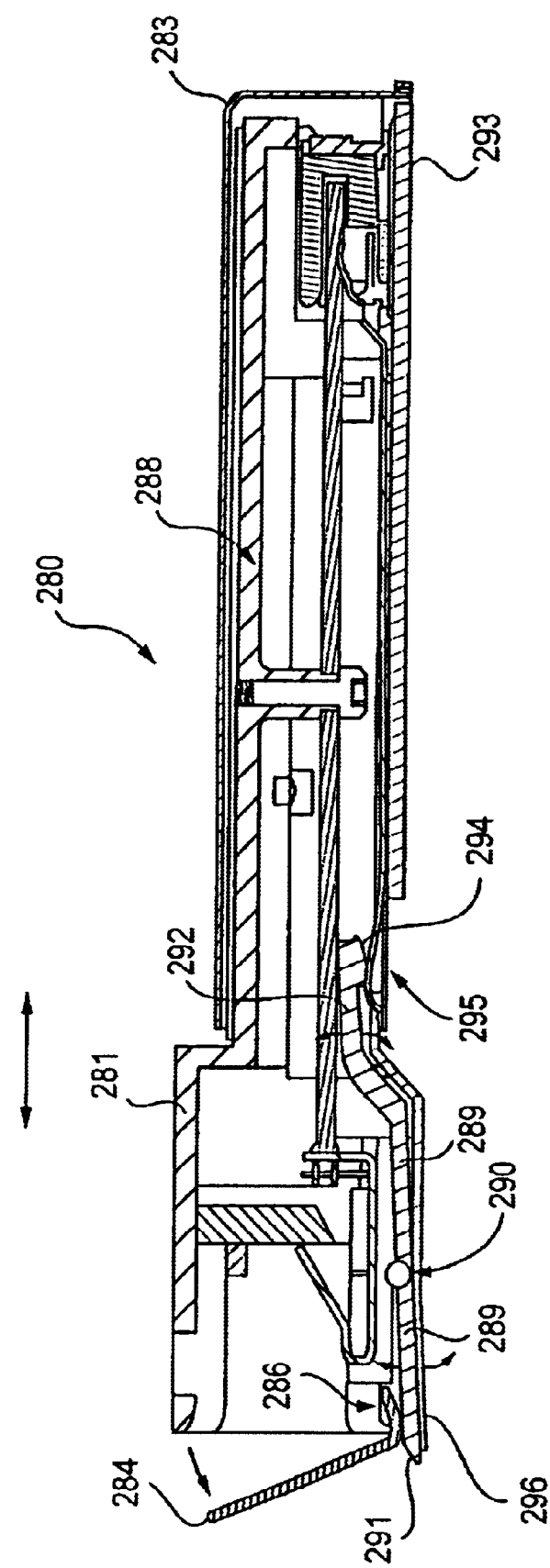
FIG. 2p is a side plan transparency view of the connector of FIG. 2n, showing the disposition of components therein.
Figure 2Q:
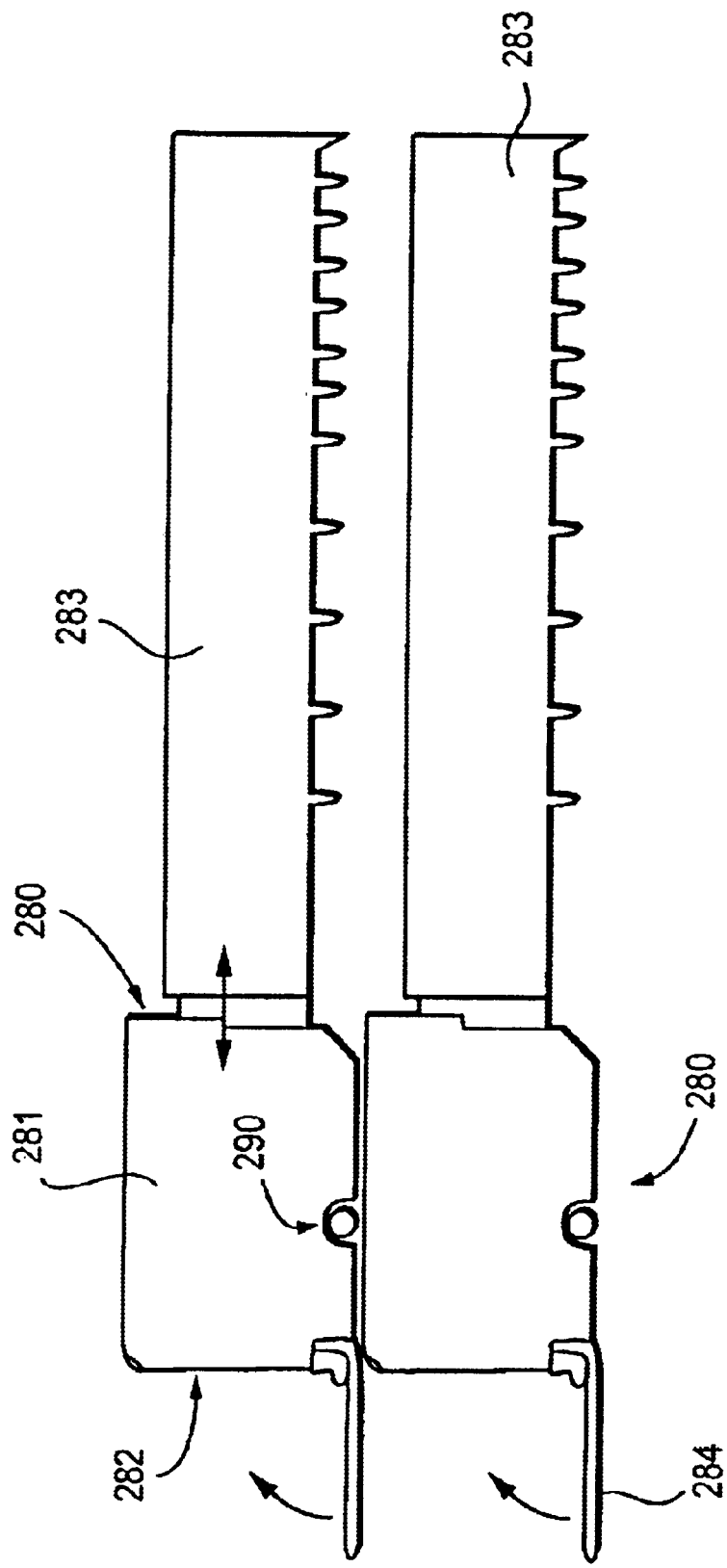
FIG. 2q is a side plan view of an exemplary "stacked" configuration of the connector(s) of FIGS. 2n–2p.

The rear component receiving portion 288 of the housing 281 is received within an external metallic shield element 283 (generally provided by the customer) which may or may not be mounted on an external PCB 293 as shown in FIGS. 2*n*–2*p*. The shield element 283 is in the illustrated embodiment a box-like structure into which the rear portion 288 inserts and is captured, the mechanism of capture being described in detail subsequently herein.

As most clearly shown in FIG. 2*o*, the connector 280 of the present embodiment includes a latch bail 284 which is disposed on the front of the housing 281 and which may be actuated by the user. Specifically, the bail 284 comprises two arms 285 and a central lever portion 286. In the illustrated embodiment, the bail comprises a unitary piece of formed metal (e.g., wire), although non-unitary and/or non-metallic structure may also be used. The bail 284 is received with apertures 287 formed in the housing 281 such that the bail 284 can rotate with respect to the apertures (and the housing as shown in the Figures. The lever portion 286 engages a latch plate 289 disposed generally on the bottom of the housing 281 and pivoted via a pivot pin arrangement 290, such that the plate 289 in effect rotates around the pivot 290. When the central lever portion 286 of the bail 284 engages the top frontal portion of the plate 289 (on the projection 291), the latch plate 289 and projection 291 are deflected away from the housing and around the pivot 290. The rear portion 292 of the plate 289 is correspondingly deflected upward (into the housing volume). These deflections allow the connector 280 itself to be inserted or removed from the shield element 283. The latching of the connector 280 into the shield element 283 is accomplished by the latch plate rear portion 292, which in the illustrated embodiment includes a raised feature 294 which engages a corresponding aperture 295 formed within the shield element 283. The plate 289 is also optionally "spring" loaded (not shown) or otherwise biased such that deflection out of its rest position (i.e., both latches engaged), requires mechanical effort, with the plate 289 returning to the rest.

In the illustrated embodiment, a substantially rigid lower bias plate 296 is disposed beneath the latch plate 289 and affixed to the housing 281, the former biasing the latter back to the rest position during deflection. This bias plate 296 may comprise any number of materials, including for example metal (e.g., spring steel or similar) or polymers. The downward deflection travel 297 of the bail 284 and projection 291 is minimal, thereby allowing use of the connector 280 in vertically space-constrained environments, as well as in "stacked" configurations (such as that of FIG. 2q, although it will be recognized that a common housing for the connectors 280 may also be used). It will be appreciated however, that other types of biasing members or schemes may be used. For example, a spring (not shown) may be disposed within a recess formed in the housing 281 aft of the pivot point and bearing on the top surface of the latch plate 289 or rear portion 292 thereof, thereby causing the latch plate to return to its rest position. As yet another alternative, the relative compliance of the latch plate itself (for example, if the latter is molded from a partially compliant polymer) could be used to accomplish the latch function; specifically, the latch plate 289 may be constructed such that when it is deflected out of the rest position, a portion of the plate 289 is biased and "bent", the resiliency of the plate to such bending acting as the restoring force for the rear portion 292 of the latch plate 289. Elastomeric bands might even be used to provide the biasing (return) force, such bands being very inexpensive and easily replaced.

Hence, to install the connector 280 within the shield element 283, the user simply displaces the bail 284 forward and downward, thereby deflecting both portions of the plate 289 as previously described. The user then simply inserts the connector 280 into the shield element 283, and releases the bail 284 to its rest (substantially vertical) position, thereby allowing the rear portion 292 to deflect downward and its raised feature 294 to engage it's corresponding shield element aperture 295, thereby securing the connector 280 within the shield. The rear portion 292 and raised element 294 may also be constructed if desired with a taper or wedge-shape on the leading edge, such that the user can merely insert the connector 280 into the shield element 283 and apply force longitudinally along the connector; the force and taper cooperate to deflect the rear portion 292 of the plate 289 upward during insertion, in effect allowing the connector to snap into to the shield element. During this motion, the projection 291 is deflected away from the bail 284 and central portion 286 thereof, largely irrespective of the latter's position.

It will be recognized by those of ordinary skill in the mechanical arts that any number of different latch and biasing techniques may be used consistent with the invention, those explicitly described herein being merely illustrative of the broader principles of the invention. For example, a button-type latch arrangement could be applied to the connector to permit installation/removal from the shield element 283. Two opposing depression tabs of the type know in the art (i.e., where the opposing forces of the user's fingers offset one another) could also be substituted.

The illustrated latch bail/plate arrangement of FIGS. 2n–2q has the advantages, however, of simplicity, low cost, and ruggedness, along with easy frontal access; i.e., the user can readily grasp the bail 284 and move it to remove the connector 280. It is further noted that the bail/plate arrangement allows the connector 280 to be removed from the shield or other enclosure while the modular plug is received within the port 282. Hence, this advantageously obviates breaking electrical continuity in order to remove the connector 280 from its supporting structure.

Furthermore, it will be appreciated by those of ordinary skill that different pivot arrangements and locations may be used. For example, one continuous pivot pin that extends nearly the width of the housing 281 may be used. Alternatively, the latch plate 289 may have tow pivots molded therein which cooperate with corresponding recesses in the sides/underside of the housing 281. Yet other types of pivots may also be used.

Light Source Embodiment

Figures 3, 3A:
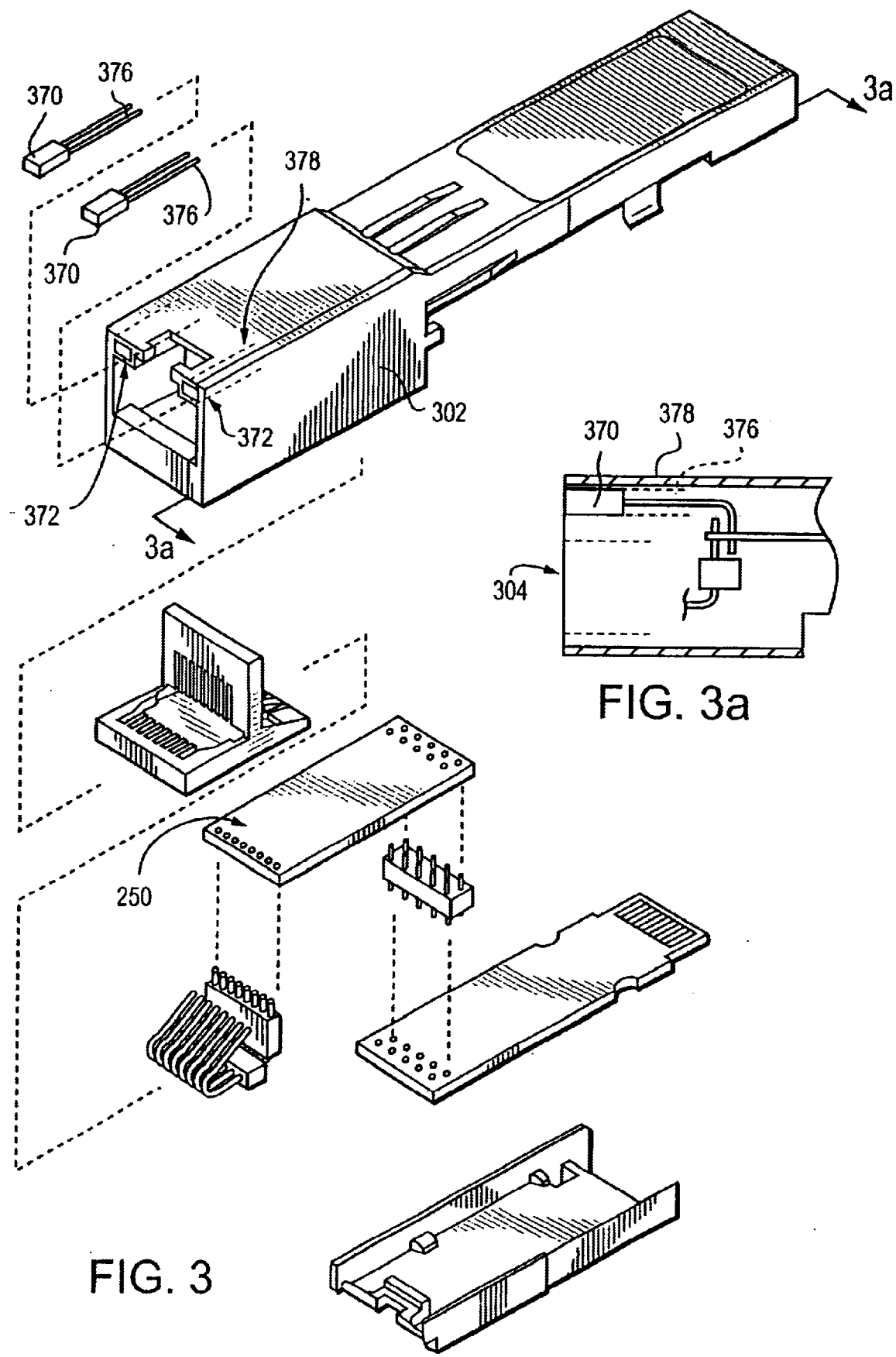

Referring now to FIGS. 3 and 3a, yet another embodiment of the improved connector of the present invention is described. As shown in FIG. 3, the connector 300 is generally identical to that previously described herein with respect to FIGS. 1–2j, with the exception that two light sources 370 are included within apertures 372 formed in the housing 302. In the illustrated embodiment, the light sources 370 comprise light-emitting diodes of the type well known in the electrical arts. The two LEDs 370 radiate visible light of the desired wavelength(s), such as green light from one LED and red light from the other, although multi-chromatic devices (such as a "white light" LED), or even other types of light sources, may be substituted if desired. Many other alternatives such as incandescent lights or even liquid crystal (LCD) or thin film transistor (TFT) devices are possible, all being well known in the electronic arts.

The body of each LED 370 is formed from a non-conducting material (e.g., optically suitable plastic), thereby providing inherent insulation between the actual diode of each LED and the metallic housing 102. The LED conductors 376 can also optionally be coated in a non-conductive material such as silicone, PVC, etc. to provide further insulation of the conductors 376 from the housing, although due to existing spacing in the apertures 372, this is not essential.

Herein underscores another benefit of the metallic housing of the present embodiment; specifically, that the cast housing 302 provides inherent noise shielding between the LEDs and (i) the external environment; and (ii) the internal components (especially conductors 136, magnetics, etc.) of the connector 300. Heretofore, more complex and costly solutions to LED noise control, such as for example metallized layers applied over the non-viewing surfaces of the LED have been employed. Additionally, it will be recognized that a significant portion of run of the LED conductors 376 can be contained within a channel 378 formed in the housing 302, thereby further mitigating noise radiated from the LEDs 370.

As shown in FIG. 3a, the conductors 376 of the light emitting diodes 370 are deformed to mate directly with corresponding apertures 250 of the first substrate 146, thereby forming an electrical path between the LED conductors 376 and the traces on the substrate 146. In the illustrated embodiment, the LED conductors 376 are deformed and inserted into apertures in the substrate 146, and then bonded thereto using reflow solder processing or the like. This arrangement advantageously reduces the length of the conductors 376 of the LEDs, thereby mitigating their radiated noise.

The apertures 372 formed within the housing element 302 each encompass their respective LED 370 when the latter is inserted therein, and securely hold the LED in place via friction between the LED and the inner walls of the recess (not shown). Alternatively, a looser fit and adhesive may be used, or both friction and adhesive.

Many other configurations for locating and retaining the LEDs 370 in position with respect to the housing element 302 may be used, such configurations being well known in the relevant art.

It will also be understood that the placement of the light sources within the connector housing 302 may be varied. For example, the LEDs 370 could be placed in a different location, such as on the rear of the substrate 146 of the connector (not shown), in tandem arrangement, with respective optical media such as light pipes of the type well known in the art being routed to the desired viewing face location.

Multi-Port Embodiment

Figure 4:
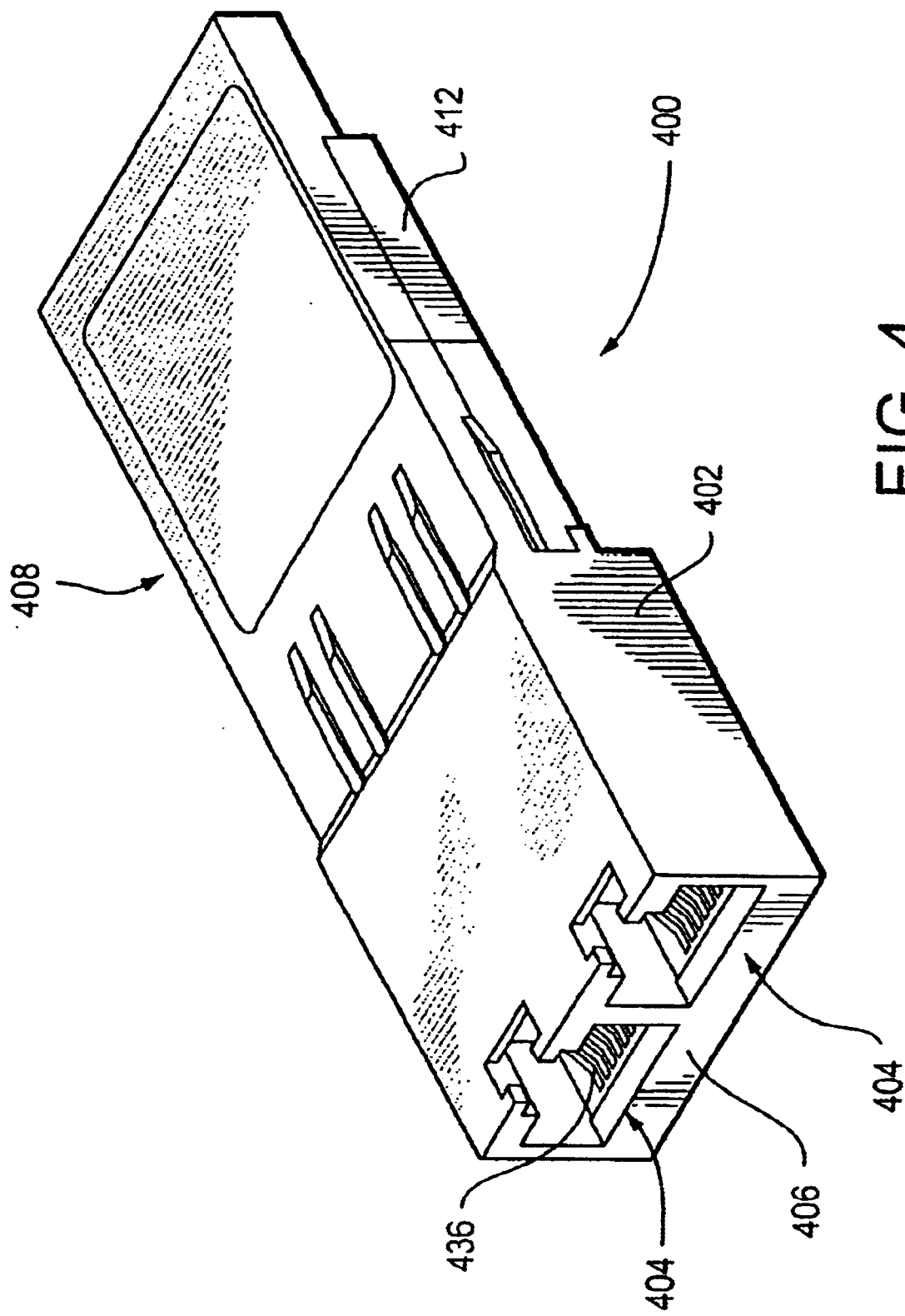
FIG. 4 is a front perspective view of a second embodiment of the connector assembly of the invention having a plurality of modular connectors arranged in a 1×N array.

Referring now to FIG. 4, another embodiment of the connector assembly of the present invention is described. As shown in FIG. 4, the assembly 400 generally comprises a connector housing element 402 having a plurality of individual connector recesses 404 formed therein (i.e., a "1×N" row) forming a port group. Specifically, the connector ports 404 are arranged in the illustrated embodiment in side-by-side row fashion within the housing 402, one disposed adjacent the other. The front walls 406 of each individual connector are further disposed parallel to one another and generally coplanar, such that modular plugs may be inserted into the plug recesses 404 formed in each connector simultaneously without physical interference. The plug recesses 404 are each adapted to receive one modular plug (not shown) having a plurality of electrical conductors disposed therein in a predetermined array, the array being so adapted to mate with respective conductors 436 present in each of the recesses 404 thereby forming an electrical connection between the plug contacts and connector conductors, as previously described with respect to FIGS. 1–2j above.

The housing 402 of the connector assembly 400 of FIG. 4 is made as a unitary casting, thereby reducing cost and providing added rigidity to the assembly. The lower sections 412 of each component portion 408 associated with each individual port within the housing 402 are made removable as in the embodiment of FIG. 1, thereby allowing individual access to the insert assembly (not shown) for each port.

It is further noted that while the embodiment of FIG. 4 comprises a row 401 of four connectors each (thereby forming a 1-by-4 array of connectors), other array configurations may be used. For example, a 1-by-2 or 1-by-8 arrangement could be used. The modular plug recesses 404 (and front faces 406) of each connector also need not necessarily be coplanar as in the embodiment of FIG. 4. Furthermore, certain connectors in the array need not have electronic components, or alternatively may have components disposed on the insert assemblies 154 different than those for other connectors in the same array.

The row of connectors may also be configured such that the latching mechanisms for each connector is reversed in orientation. That is, the flexible tab and recess arrangement of the type commonly used on RJ modular jacks (although other types may be substituted) may be configured in "latch up" or "latch down" arrangement (or combinations thereof) to accommodate ease of use by the operator.

Method of Manufacture

Figure 5:
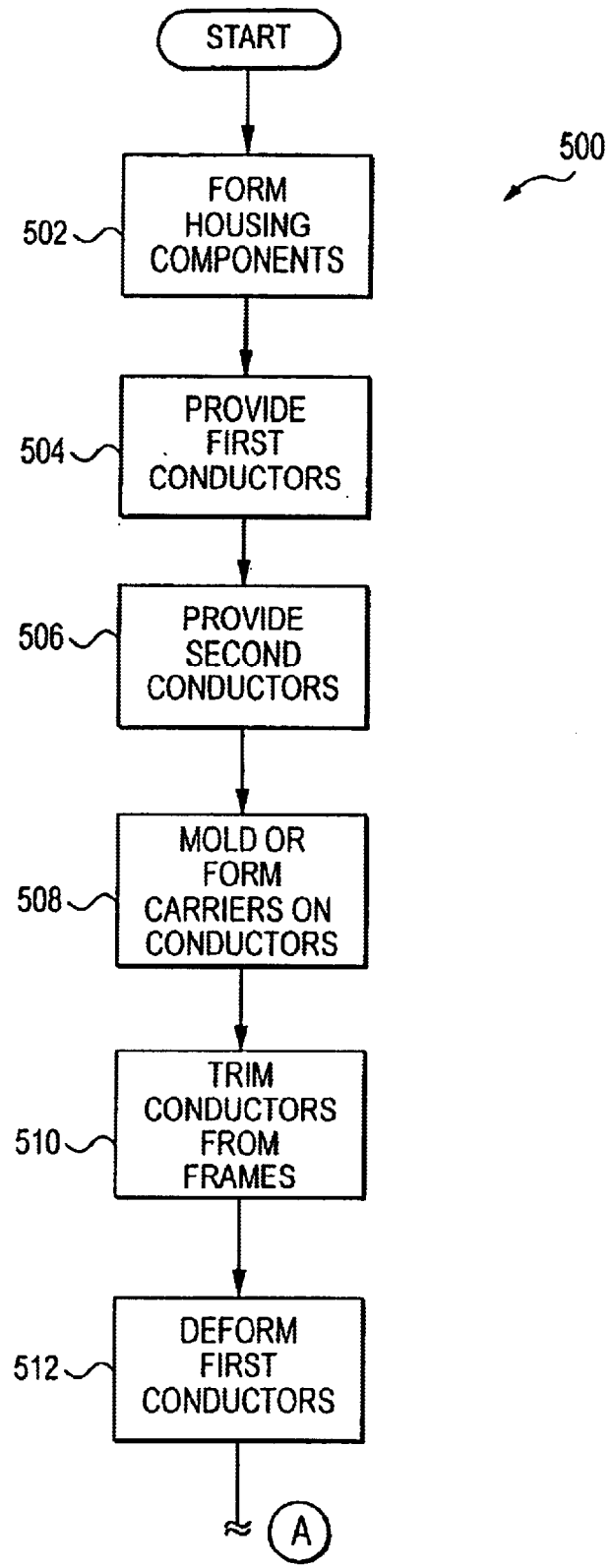
FIG. 5 is a logical flow diagram illustrating one exemplary embodiment of the method of manufacturing the connector assembly of the present invention.
Figure 5:
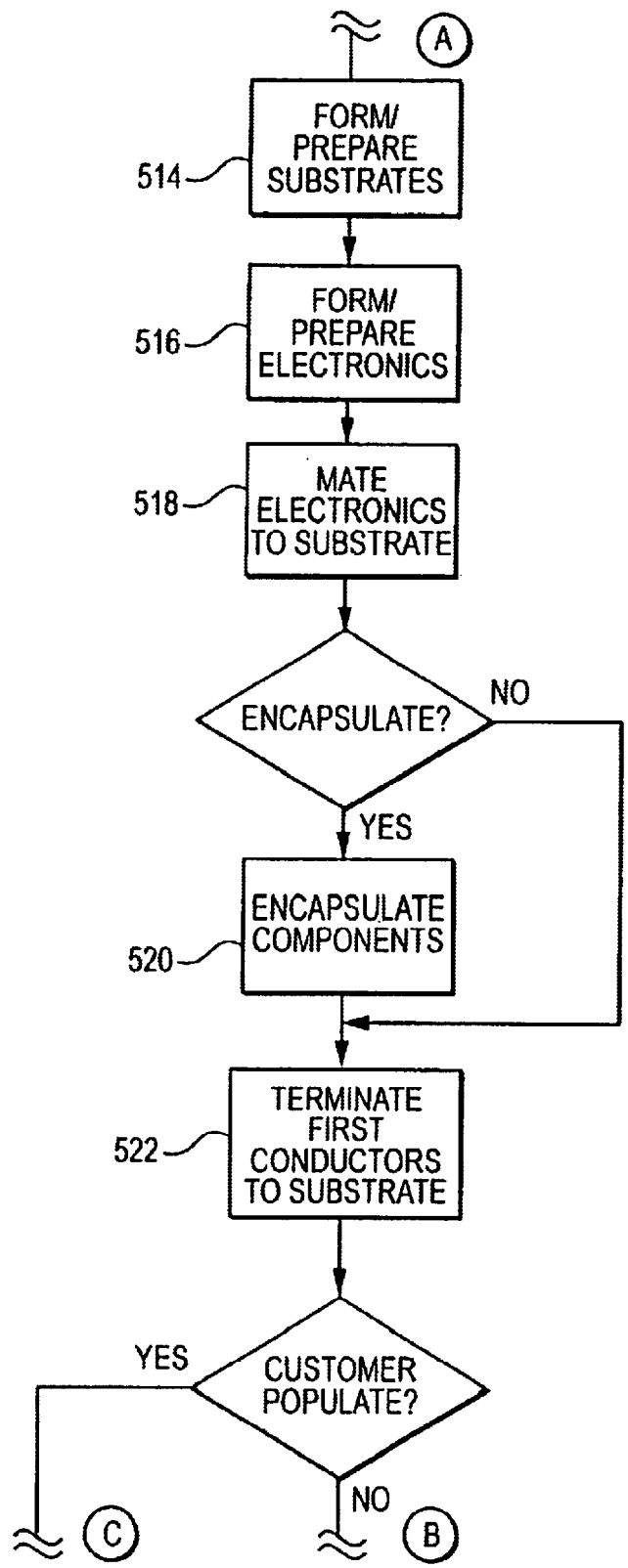
Figure 5:
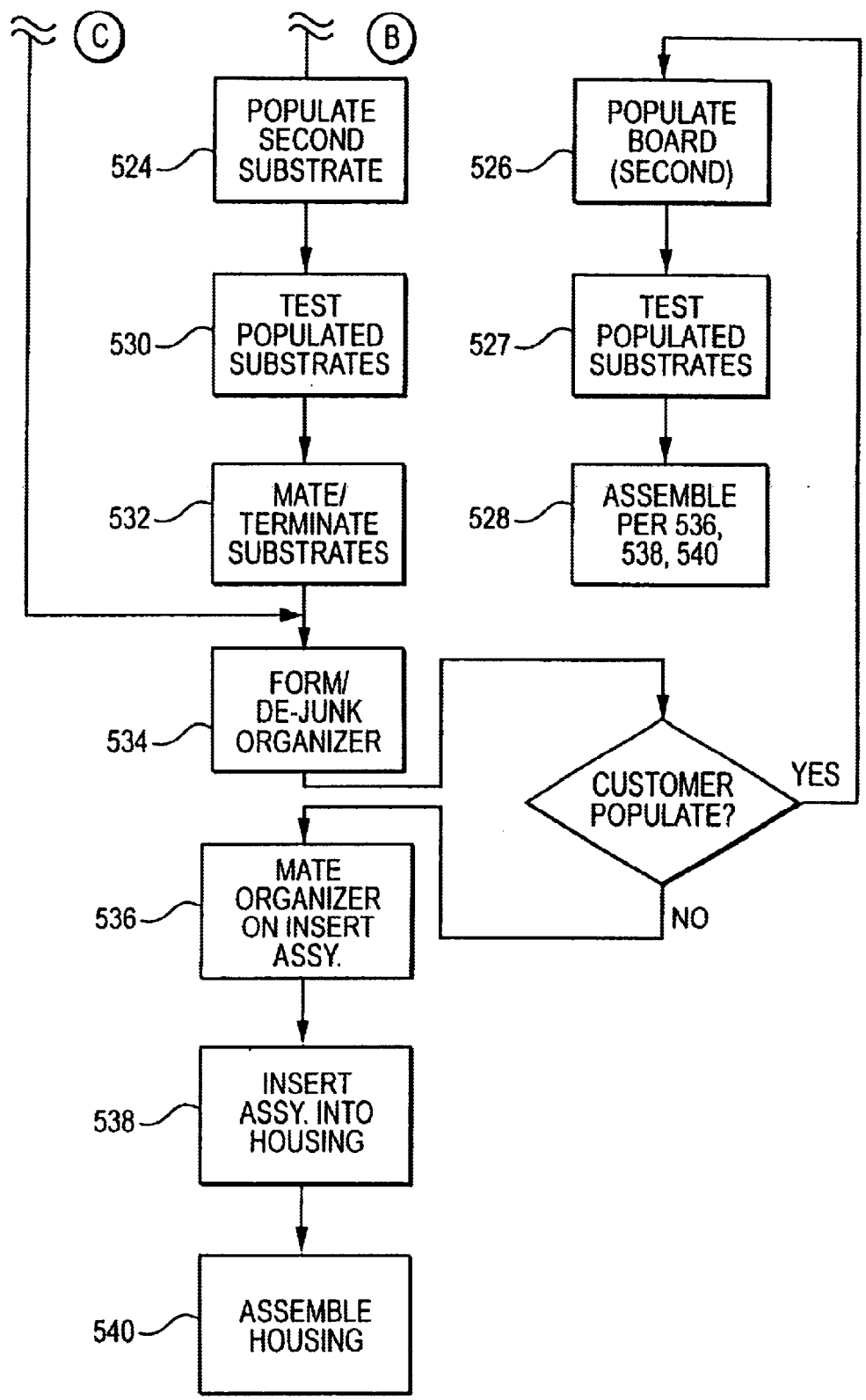

Referring now to FIG. 5, the method 500 of manufacturing the aforementioned connector assembly 100 is described in detail. It is noted that while the following description of the method 500 of FIG. 5 is cast in terms of the single port connector assembly without light sources, the broader method of the invention is equally applicable to other configurations (e.g., the 1×N embodiment of FIG. 4, the LED embodiment of FIG. 3, etc.).

In the embodiment of FIG. 5, the method 500 generally comprises first forming the assembly housing element 102 in step 502. The housing is formed using a metallurgical casting process of the type well known in the art, although other processes may be used. The casting process is chosen for its ability to adequately replicate details of the mold, low cost, and ease of processing. As part of this step, the housing element 102 is also "de-junked" and flashing trimmed as needed.

Next, a first conductor set is provided in step 504. As previously described, the conductor set comprises metallic (e.g., copper or aluminum alloy) strips having a substantially square or rectangular cross-section and sized to fit within the grooves 180 of the organizer 130 and in the housing 102.

In step 506, a sets of second conductors 148 (used within the third carrier 150 of the insert assembly) are provided. These conductors are provided in the form of a common lead frame assembly of the type well known in the art. The various terminals are arranged such that the molding of the third carrier body can be performed while the terminals are still attached to the lead frame.

In step 508, the various carriers 142, 144, 150 are molded onto the lead frames of the respective first and second conductors. The conductors are next trimmed from their respective lead frames to an appropriate length (step 510). The first conductors 136 with molded carriers 142, 144 are trimmed to produce an unfinished conductor assembly. The conductors 136 are then deformed as previously described (step 512) to produce the finished first conductor assembly shown in FIG. 2a.

Note also that either or both of the aforementioned first and second conductor sets may also be notched (not shown) at the appropriate end such that electrical leads associated with the electronic components (e.g., fine-gauge wire wrapped around a magnetic toroid element) may be wrapped around the distal end notch to provide a secure electrical connection.

Next, the substrates 146, 152 are formed and perforated through their thickness with a number of apertures 250 of predetermined size in step 514. Methods for forming substrates are well known in the electronic arts, and accordingly are not described further herein. Any conductive traces and terminal pads on the substrates required by the particular design are also added, such that necessary ones of the conductors 136, 148 when received within the apertures, are in electrical communication with the traces. As previously discussed, the apertures within the substrate are arranged in arrays of juxtaposed perforations, and with spacing (i.e., pitch) such that their position corresponds to the desired pattern, although other arrangements may be used. Any number of different methods of perforating the substrate may be used, including a rotating drill bit, punch, heated probe, or even laser energy. Alternatively, the apertures may be formed at the time of formation of the substrate itself, thereby obviating a separate manufacturing step.

In step 516, one or more electronic components, such as the aforementioned toroidal coils and surface mount devices, are next formed and prepared (if used in the design). The manufacture and preparation of such electronic components is well known in the art, and accordingly is not described further herein. The electronic components are then mated to the first substrate 146 in step 518. Note that if no components are used, the conductive traces formed on/within the primary substrate will form the conductive pathway between the interface portions 140 of the first conductors 136 and respective ones of the second conductors 148. The components may optionally be (i) received within corresponding apertures designed to receive portions of the component or its terminals (e.g., for mechanical stability), (ii) bonded to the substrate such as through the use of an adhesive or encapsulant, (iii) mounted in "free space" (i.e., held in place through tension generated on the electrical leads of the component when the latter are terminated to the substrate conductive traces and/or conductor distal ends, or (iv) maintained in position by other means. In one embodiment, the surface mount components are first positioned on the primary substrate, and the magnetics (e.g., toroids) positioned thereafter, although other sequences may be used. The components are electrically coupled to the PCB using a eutectic solder re-flow process as is well known in the art. The assembled primary substrate with electronic components is then optionally secured with a silicon encapsulant (step 520), although other materials may be used.

Per step 522, the deformed and assembled first conductors 136 and carriers 142, 144 from step 512 are terminated to the populated first substrate 146 as shown in FIG. 2.

In step 524, the second substrate 152 is optionally populated with electronic components as described above with respect to the first substrate 146. In another exemplary embodiment, the second substrate 152 is "customer" populated; i.e., the customer purchasing the device decides on the types, number, and locations of components on the second substrate 152. For example, one anticipated marketing configuration for the invention includes providing the customer with a partly assembled connector with the first substrate 146 electrically populated and terminated, while the second substrate 152 is neither. The customer then populates and terminates the second substrate 152 (step 526), and then completes assembly of the connector 100 (steps 527 and 528). This provides the customer with great flexibility in configuring their device(s). In another alternate approach, the customer sends the populated second board back to the manufacturer, who then completes the termination and assembly.

In step 530 the populated substrate(s) 146 (152) with components/magnetics are electrically tested to ensure proper operation.

The two populated substrates 146, 152 (if manufacturer-population of the second board is used) are then terminated to one another as shown in FIG. 2 using the third carrier 150 and second conductors 148 and a solder reflow process (step 532).

Next, the organizer element 130 is formed using a molding process such as that previously described (step 534). As part of this process, the organizer element is de-junked and trimmed as needed.

In step 536, the formed and de-junked organizer 130 is mated to the first conductors 136 (and associated first carrier 142) by sliding the latter into the organizer slot 174 adapted to receive the carrier 142. The contact portions 138 of the conductors 136 received into respective ones of the grooves 180b formed in the organizer 130 as previously described.

The carrier 142 may be fixed in position within the organizer 130 using adhesive, heat staking, friction, etc. if desired. At the completion of step 536, the insert assembly 154 of FIG. 2 is completed.

In step 538, the finished insert assembly 154 is then inserted into the cavity 111 of the housing element 102.

Lastly, in step 540, the lower housing element 112 of the rear portion 108 is fitted into place and secured (e.g., snapped, glued, screwed, etc.), thereby completing the assembly of the connector assembly 100.

With respect to the other embodiments described herein (i.e., multi-port 1×N connector housing, connector with LEDs, etc.), the foregoing method may be modified as necessary to accommodate the additional components. For example, where a multi-port connector is used, a single common housing element is fabricated. Such modifications and alterations will be readily apparent to those of ordinary skill, given the disclosure provided herein.

It will be recognized that while certain aspects of the invention are described in terms of a specific sequence of steps of a method, these descriptions are only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A connector assembly comprising:
   a connector housing comprising a recess adapted to receive at least a portion of an RJ-type modular plug, said modular plug having a plurality of terminals disposed thereon, said housing further comprising first and second portions;
   a first substrate having a plurality of electrically conductive pathways associated therewith;
   a second substrate having a plurality of electrically conductive pathways associated therewith;
   a plurality of first conductors disposed at least partly within said recess, said first conductors being configured to form an electrical contact with respective ones of said terminals when said modular plug is received within said recess, and form at least one electrical pathway between said first conductors and at least one of said plurality of conductive pathways of said first substrate;
   a plurality of second conductors, at least one of said second conductors being in electrical communication with respective ones of at least a portion of said plurality of electrically conductive pathways of said first substrate, and adapted to electrically interface with corresponding electrical pathways of said second substrate; and a cavity adapted to receive at least a portion of said first and second conductors and said first and second substrates therein;

wherein said first and second portions of said housing cooperate to form at least a portion of said cavity when said housing portions are assembled.

2. The connector assembly of claim 1, wherein said first and second housing portions are substantially metallic.

3. The connector assembly of claim 2, wherein said metal comprises Zinc.

4. The connector assembly of claim 1, wherein said first and second substrates are substantially parallel.

5. The connector assembly of claim 4, wherein said first and second substrates are disposed in substantially horizontal fashion within said housing.

6. The connector assembly of claim 1, further comprising an edge connector, wherein said edge connector is comprised at least in part of a portion of at least one of said first and second substrates.

7. The connector assembly of claim 6, wherein said first and second housing portions further define an aperture, said aperture adapted to receive at least a portion of an external device for mating with said edge connector.

8. The connector assembly of claim 1, wherein said modular plug comprises an RJ-45 type plug, and said connector is adapted to pass at least some data at a rate greater than 1 Mbps.

9. A connector comprising:

a connector housing comprising a recess adapted to receive at least a portion of an RJ-type modular plug, said modular plug having a plurality of terminals disposed thereon, said housing further comprising first and second portions;

at least one substrate having a plurality of electrically conductive pathways associated therewith; and a plurality of first conductors disposed at least partly within said recess, said first conductors being configured to form an electrical contact with respective ones of said terminals when said modular plug is received within said recess, and form at least one electrical pathway between said terminals and at least one of said plurality of conductive pathways of said first substrate;

wherein said first and second housing portions comprise substantially metallic castings.

10. The connector of claim 9, further comprising an edge connector, wherein said edge connector is comprised at least in part of a portion of said at least one substrate.

11. The connector of claim 10, wherein said first and second housing portions further define an aperture, said aperture adapted to receive at least a portion of an external device for mating with said edge connector.

12. The connector of claim 9, wherein said modular plug comprises an RJ-45 type plug, and said connector is adapted to pass at least some data at a rate greater than 1 Mbps.

13. A connector comprising:

a connector housing comprising a recess adapted to receive at least a portion of an RJ-type modular plug, said modular plug having a plurality of terminals disposed thereon, said housing further comprising at least one substantially cast metallic component adapted for shielding noise in or out of said connector;

at least one substrate having a plurality of electrically conductive pathways associated therewith;

a plurality of electronic components electrically disposed within at least some of said conductive pathways; and a plurality of first conductors disposed at least partly within said recess, said first conductors being configured to form an electrical contact with respective ones of said terminals when said modular plug is received within said recess, and form at least one electrical pathway between said terminals and at least one of said plurality of conductive pathways of said substrate.

14. The connector of claim 13, further comprising at least one LED, said at least one LED being viewable from a front face of said housing and electrically terminated to at least one of said conductive pathways of said at least one substrate.

15. The connector of claim 13, further comprising:

a latch actuator disposed substantially proximate to said recess, said latch actuator being operatively coupled to a latch mechanism adapted to selectively engage a corresponding portion of an external structure, the actuation of said actuator allowing at least removal of said connector from said structure.

16. A shielded electrical connector, comprising:

a cast metallic housing having a front portion and rear portion, said front portion having at least one modular RJ-type plug port disposed therein;

a plurality of conductive pathways communicating with said at least one port; and a plurality of signal conditioning components disposed within said housing and electrically within at least a portion of said conductive pathways;

wherein said rear portion is adapted to be received substantially within an external structure, said structure being configured to further mitigate noise transmission by said connector.

17. The electrical connector of claim 16, wherein substantially all of said signal conditioning components are disposed within the interior volume of said structure when said connector is received therein.

18. A connector assembly comprising:

a substantially metallic connector housing comprising a recess adapted to receive at least a portion of an RJ-45 modular plug, said modular plug having a plurality of terminals disposed thereon, said housing further comprising first and second portions;

a first substrate having a plurality of electrically conductive pathways associated therewith;

a second substrate having a plurality of electrically conductive pathways associated therewith;

a plurality of first conductors disposed at least partly within said recess, said first conductors being configured to form an electrical contact with respective ones of said terminals when said modular plug is received within said recess, and form at least one electrical pathway between said first conductors and at least one of said plurality of conductive pathways of said first substrate;

a plurality of second conductors, at least one of said second conductors being in electrical communication with respective ones of at least a portion of said plurality of electrically conductive pathways of said first substrate, and adapted to electrically interface with corresponding electrical pathways of said second substrate;

a cavity adapted to receive at least a portion of said first and second conductors and said first and second substrates therein;

an edge-type connector comprised at least in part of a portion of one of said first and second substrates; and a latch mechanism adapted to allow selective removal of said connector from an external structure;

wherein said first and second portions of said housing cooperate to form at least a portion of said cavity when said housing portions are assembled.

19. The connector of claim 18, further comprising a latch actuator disposed substantially proximate to said port, said latch actuator being operatively coupled to a latch mechanism adapted to selectively engage a corresponding portion of an external structure, the actuation of said actuator allowing at least removal of said connector from said structure.

* * * * *

UNITED STATES PATENT AND TRADEMARK OFFICE
CERTIFICATE OF CORRECTION

PATENT NO.    : 6,848,943 B2
DATED         : February 1, 2005
INVENTOR(S)   : Russell L. Machado et al.

It is certified that error appears in the above-identified patent and that said Letters Patent is hereby corrected as shown below:

Column 2, lines 63-67 thru Column 3, lines 1-8,

"In a fifth aspect of the invention, an improved method of manufacturing the connector and insert assembly of the present invention is disclosed. The method generally comprises: forming an organizer element having a plurality of grooves and adapted to be received within the connector housing; forming a plurality of first conductors; providing a plurality of second conductors; providing first and second substrates; mating a portion of the first conductors to the first substrate, and the second conductors to both the first and second substrates; positioning the first conductors within the organizer element, thereby completing the insert assembly. The insert assembly is then disposed within a housing to form the connector."

should read:

--In a fifth aspect of the invention, an improved method of manufacturing the connector and insert assembly of the present invention is disclosed. In one exemplary embodiment, the method comprises: forming an organizer element having a plurality of grooves and adapted to be received within the connector housing; forming a plurality of first conductors; providing a plurality of second conductors; providing first and second substrates; mating a portion of the first conductors to the first substrate, and the second conductors to both the first and second substrates; positioning the first conductors within the organizer element, thereby completing the insert assembly. The insert assembly is then disposed within a housing to form the connector.--

Signed and Sealed this

Tenth Day of May, 2005

JON W. DUDAS
*Director of the United States Patent and Trademark Office*